United States Patent [19]

Mistry et al.

[11] Patent Number: 5,731,046

[45] Date of Patent: *Mar. 24, 1998

[54] FABRICATION OF DIAMOND AND DIAMOND-LIKE CARBON COATINGS

[75] Inventors: Pravin Mistry, Shelby Township; Manuel C. Turchan, Northville, both of Mich.

[73] Assignee: QQC, Inc., Dearborn, Mich.

[*] Notice: The term of this patent shall not extend beyond the expiration date of Pat. No. 5,554,415.

[21] Appl. No.: 241,930

[22] Filed: May 12, 1994

Related U.S. Application Data

[63] Continuation-in-part of Ser. No. 182,978, Jan. 18, 1994, Pat. No. 5,554,415, and a continuation-in-part of Ser. No. 184,041, Jan. 21, 1994.

[51] Int. Cl.$^6$ .............................. B05D 3/06; C23C 16/26
[52] U.S. Cl. .......................... 427/553; 427/554; 427/595; 427/596; 427/249; 427/255.4
[58] Field of Search ....................... 427/249, 255.4, 427/553, 554, 555, 556, 595, 596, 597; 148/241, 278, 512, 525, 565; 219/121.85; 423/446

[56] References Cited

U.S. PATENT DOCUMENTS

| | | | |
|---|---|---|---|
| 3,913,280 | 10/1975 | Hall | 51/307 |
| 4,139,936 | 2/1979 | Abrams et al. | 29/264 |
| 4,248,606 | 2/1981 | Bovenkerk et al. | 51/307 |
| 4,260,397 | 4/1981 | Bovenkerk | 51/307 |
| 4,333,986 | 6/1982 | Tsuji et al. | 428/402 |
| 4,343,628 | 8/1982 | Taylor | 51/298 |
| 4,388,517 | 6/1983 | Schulte et al. | 427/555 |
| 4,412,980 | 11/1983 | Tsuji et al. | 423/446 |
| 4,425,315 | 1/1984 | Tsuji et al. | 423/446 |
| 4,437,962 | 3/1984 | Banks | 204/192 C |
| 4,490,229 | 12/1984 | Mirtich et al. | 204/192 C |
| 4,495,044 | 1/1985 | Banks | 204/192 C |
| 4,504,519 | 3/1985 | Zelez | 427/39 |
| 4,522,680 | 6/1985 | Ogawa | 156/624 |
| 4,536,442 | 8/1985 | Bovenkerk et al. | 428/323 |
| 4,547,257 | 10/1985 | Iizuka et al. | 156/603 |

(List continued on next page.)

FOREIGN PATENT DOCUMENTS

| | | | |
|---|---|---|---|
| 1008618 | 10/1965 | United Kingdom | 219/121.85 |

OTHER PUBLICATIONS

"Laser Plasma Boosts Diamond Film Deposition", Technical Insights, Inc., vol. 19, No. 14, Apr. 1990, p. 2.
"Breakthroughs: super–adherent metal; a layer of diamond", Modern Plastics, vol. 68, No. 2, Feb. 1991, p. 26.
"Diamondizing", Modern Plastics, vol. 68, No. 5, May 1991, p. 64.
"Characterizing Diamond Films", SPEX, Raman Application Note No. 14, copyright 1992 No page number.
"Novel Pulsed Laser Deposition of Thin Films", Tyrell, et al., IEEE, copyright 1993 No page number.
"Westinghouse, SGS Tool Target Commercial Diamond Films", PR Newswire, Feb. 1993 No page number.
"Westinghouse Sees Gold in Diamond Coatings", Business Week, No. 3306, p. 91, Feb. 1993.

(List continued on next page.)

Primary Examiner—Roy V. King
Attorney, Agent, or Firm—Harness, Dickey & Pierce, P.L.C.

[57] ABSTRACT

Energy, such as from three different lasers, is directed at the surface of a substrate to mobilize and vaporize a carbon constituent element (e.g., carbide) within the substrate (e.g., steel). The vaporized constituent element is reacted by the energy to alter its physical structure (e.g., from carbon to diamond) to that of a composite material which is diffused back into the substrate as a composite material. An additional secondary element, which also contains carbon, may optionally be directed (e.g., sprayed) onto the substrate to augment, enhance and/or modify the formation of the composite material, as well as to supply sufficient or additional material for fabricating a diamond or diamond-like coating on the surface of the substrate. The process can be carried out in an ambient environment (e.g., without a vacuum), and without pre-heating or post-cooling of the substrate.

23 Claims, 9 Drawing Sheets

U.S. PATENT DOCUMENTS

| | | | |
|---|---|---|---|
| 4,568,565 | 2/1986 | Gupta et al. | 427/53.1 |
| 4,603,082 | 7/1986 | Zelez | 428/336 |
| 4,617,181 | 10/1986 | Yazu et al. | 423/446 |
| 4,627,503 | 12/1986 | Horton | 178/320 |
| 4,629,373 | 12/1986 | Hall | 407/118 |
| 4,647,546 | 3/1987 | Hall, Jr. et al. | 501/96 |
| 4,681,640 | 7/1987 | Stanley | 148/1.5 |
| 4,701,592 | 10/1987 | Cheung | 219/121 LT |
| 4,732,778 | 3/1988 | Kawasaki | 427/53.1 |
| 4,751,193 | 6/1988 | Myrick | 437/19 |
| 4,762,729 | 8/1988 | Hirano et al. | 427/38 |
| 4,770,940 | 9/1988 | Ovshinsky et al. | 428/408 |
| 4,797,241 | 1/1989 | Peterson et al. | 264/60 |
| 4,806,900 | 2/1989 | Fujimori et al. | 338/22 R |
| 4,830,702 | 5/1989 | Singh et al. | 156/613 |
| 4,836,881 | 6/1989 | Satoh et al. | 156/621 |
| 4,849,199 | 7/1989 | Pinneo | 423/446 |
| 4,853,250 | 8/1989 | Boulos et al. | 427/34 |
| 4,874,596 | 10/1989 | Lemelson | 423/446 |
| 4,880,613 | 11/1989 | Satoh et al. | 423/446 |
| 4,882,138 | 11/1989 | Pinneo | 423/466 |
| 4,882,237 | 11/1989 | Kayama | 428/699 |
| 4,892,751 | 1/1990 | Miyake et al. | 427/34 |
| 4,898,748 | 2/1990 | Kruger et al. | 427/38 |
| 4,910,041 | 3/1990 | Yanagihara et al. | 427/37 |
| 4,925,701 | 5/1990 | Jansen et al. | 427/38 |
| 4,937,094 | 6/1990 | Doehler et al. | 427/38 |
| 4,938,940 | 7/1990 | Hirose et al. | 423/445 |
| 4,939,763 | 7/1990 | Pinneo et al. | 378/161 |
| 4,948,629 | 8/1990 | Hacker et al. | 427/53.1 |
| 4,949,347 | 8/1990 | Satoh et al. | 372/41 |
| 4,950,625 | 8/1990 | Nakashima et al. | 501/86 |
| 4,954,365 | 9/1990 | Neifeld | 427/53.1 |
| 4,957,591 | 9/1990 | Sato et al. | 156/643 |
| 4,957,773 | 9/1990 | Spencer et al. | 427/39 |
| 4,981,717 | 1/1991 | Thaler | 427/53.1 |
| 4,986,214 | 1/1991 | Zumoto | 118/722 |
| 4,987,007 | 1/1991 | Wagal et al. | 427/53.1 |
| 5,008,737 | 4/1991 | Burnham et al. | 357/81 |
| 5,015,528 | 5/1991 | Pinneo | 428/403 |
| 5,017,317 | 5/1991 | Marcus | 264/81 |
| 5,037,666 | 8/1991 | Mori | 427/38 |
| 5,038,322 | 8/1991 | Van Loenen | 365/114 |
| 5,043,219 | 8/1991 | Yoshida et al. | 428/408 |
| 5,045,345 | 9/1991 | Singer | 427/33.1 |
| 5,066,515 | 11/1991 | Ohsawa | 427/53.1 |
| 5,071,677 | 12/1991 | Patterson et al. | 427/249 |
| 5,075,095 | 12/1991 | Pinneo | 423/446 |
| 5,080,752 | 1/1992 | Kabacoff et al. | 156/603 |
| 5,080,753 | 1/1992 | Doll et al. | 156/609 |
| 5,082,359 | 1/1992 | Kirkpatrick | 359/642 |
| 5,087,434 | 2/1992 | Frenklach et al. | 423/446 |
| 5,093,149 | 3/1992 | Doehler et al. | 427/38 |
| 5,094,915 | 3/1992 | Subramaniam | 428/408 |
| 5,096,352 | 3/1992 | Lemelson | 411/424 |
| 5,096,740 | 3/1992 | Nakagama et al. | 427/53.1 |
| 5,098,737 | 3/1992 | Collins et al. | 427/53.1 |
| 5,106,452 | 4/1992 | Kadano et al. | 156/613 |
| 5,108,778 | 4/1992 | Suzuki et al. | 427/38 |
| 5,127,983 | 7/1992 | Imai et al. | 156/610 |
| 5,130,111 | 7/1992 | Pryor | 423/446 |
| 5,131,963 | 7/1992 | Ravi | 148/33.3 |
| 5,139,591 | 8/1992 | Doll et al. | 156/609 |
| 5,144,110 | 9/1992 | Marantz et al. | 219/121.48 |
| 5,145,711 | 9/1992 | Yamazaki et al. | 427/38 |
| 5,154,945 | 10/1992 | Baldwin et al. | 427/596 |
| 5,169,579 | 12/1992 | Marcus et al. | 264/81 |
| 5,174,826 | 12/1992 | Mannava et al. | 138/729 |
| 5,176,788 | 1/1993 | Kabacoff et al. | 156/603 |
| 5,180,571 | 1/1993 | Hosoya et al. | 413/446 |
| 5,194,714 | 3/1993 | Le Sergent | 219/121.36 |
| 5,200,231 | 4/1993 | Bachmann et al. | 427/573 |
| 5,209,812 | 5/1993 | Wu et al. | 156/613 |
| 5,209,916 | 5/1993 | Gruen | 423/446 |
| 5,213,848 | 5/1993 | Zurecki et al. | 427/449 |
| 5,215,788 | 6/1993 | Murayam et al. | 427/450 |
| 5,221,411 | 6/1993 | Narayan | 156/603 |
| 5,221,501 | 6/1993 | Feldman et al. | 264/1.2 |
| 5,224,645 | 7/1993 | Cooper et al. | 228/157 |
| 5,224,969 | 7/1993 | Chen et al. | 51/295 |
| 5,230,740 | 7/1993 | Pinneo | 118/723 |
| 5,230,931 | 7/1993 | Yamazaki et al. | 427/569 |
| 5,234,724 | 8/1993 | Schmidt | 427/530 |
| 5,236,545 | 8/1993 | Pryor | 156/613 |
| 5,236,740 | 8/1993 | Peters et al. | 427/249 |
| 5,237,152 | 8/1993 | Gegenwart | 219/121.47 |
| 5,242,711 | 9/1993 | DeNatale et al. | 427/249 |
| 5,243,170 | 9/1993 | Maruyama et al. | 219/121.59 |
| 5,250,780 | 10/1993 | Hansz et al. | 219/121.49 |
| 5,260,106 | 11/1993 | Kawarada et al. | 427/577 |
| 5,264,061 | 11/1993 | Juskey et al. | 156/214 |
| 5,264,071 | 11/1993 | Anthony et al. | 156/612 |
| 5,270,077 | 12/1993 | Knemeyer et al. | 427/249 |
| 5,270,114 | 12/1993 | Herb et al. | 428/403 |
| 5,271,890 | 12/1993 | Shimura et al. | 427/596 |
| 5,271,971 | 12/1993 | Herb et al. | 427/577 |
| 5,273,731 | 12/1993 | Anthony et al. | 423/446 |
| 5,273,788 | 12/1993 | Yu | 427/554 |
| 5,273,790 | 12/1993 | Herb et al. | 427/577 |
| 5,273,825 | 12/1993 | Herb et al. | 428/408 |
| 5,275,798 | 1/1994 | Aida | 423/446 |
| 5,284,709 | 2/1994 | Herb et al. | 428/408 |
| 5,285,046 | 2/1994 | Hansz | 219/121.47 |
| 5,290,368 | 3/1994 | Gavigan et al. | 148/212 |
| 5,290,392 | 3/1994 | Lau et al. | 156/610 |
| 5,302,231 | 4/1994 | Bovenkerk et al. | 156/614 |
| 5,304,249 | 4/1994 | Chosa | 118/728 |
| 5,308,661 | 5/1994 | Feng et al. | 427/535 |
| 5,366,556 | 11/1994 | Prince et al. | 118/722 |

OTHER PUBLICATIONS

"More Research in Diamond Coatings: Technology Trends", American Machinist, vol. 137, No. 3, p. 113, Mar. 1993.

"Toward Affordable Diamond Film", Technical Insights, Inc., vol. 22, No. 9, p. 1, Mar. 1993.

"Diamond Coating is a drill's best friend", Times Newspapers Limited, Mar. 1993 No page number.

"Diamonds with everything", Fuhrman, Forbes, pp. 100–101, Mar. 1993.

"Room–Temperature Diamonds Go Commercial", High–Tech Materials Alert, vol. 10, No. 5, p. 2, May 1993.

"Thin–film diamond at the cutting edge", Tooling & Production, vol. 59, No. 4, p. 27, Jul. 1993.

"Diamond Thin Film", Noaker, Manufacturing Engineering, pp. 63–65, Jul. 1993.

"Thin–film diamond at the cutting edge", Destefani, Tooling & Production, pp. 27–32, Jul. 1993.

"Diamond May Prove Ideal Display Screen", The New York Times, Section C, Column 1, p. 1, Sep. 1993.

"So Rapid Prototyping Works", Manufacturing Engineering, pp. 37–42, Nov. 1993.

"Advanced Ceramics Cutting Tools", High–Tech Materials Alert, vol. 10, No. 11, p. 5, Dec. 1993.

"Rapid Prototyping Moves Toward Rapid Tooling", Ogando, Plastics Technology, pp. 40–44, Jan. 1994.

"The Diamond Empire", Frontline Show # 1209, 12 pages, Feb. 1994.

"CVD Diamonds and Related Superhard Materials", Russell, DR Reports, vol. 1: Technology, Application and Market Scenarios, Jun. 1993 No page numbers.

"CVD Diamond and Related Superhard Materials", Russell, DR Reports, vol. 2: Organization Activities in CVD Development, Jun. 1993, No page numbers.

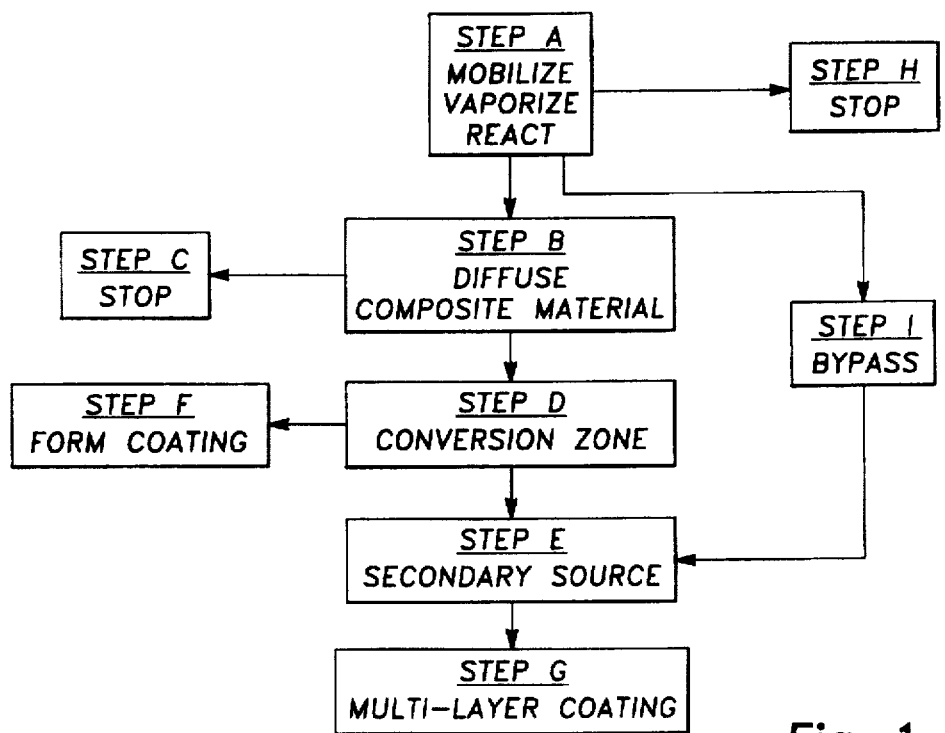
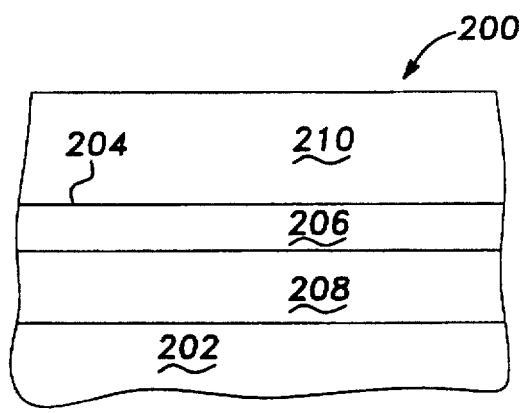
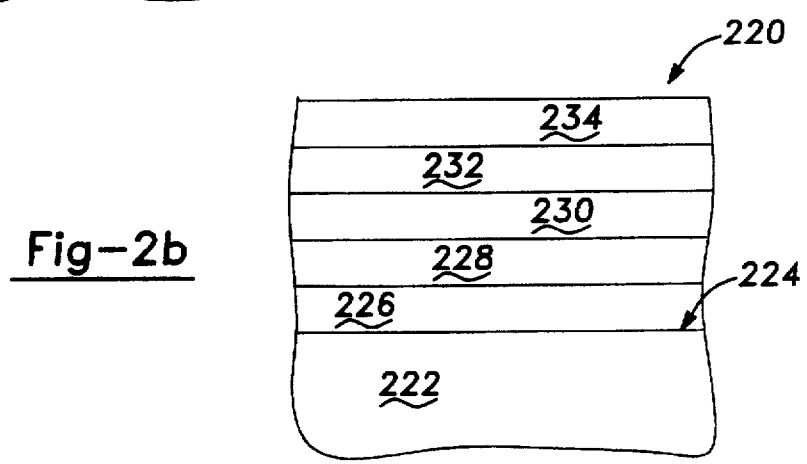

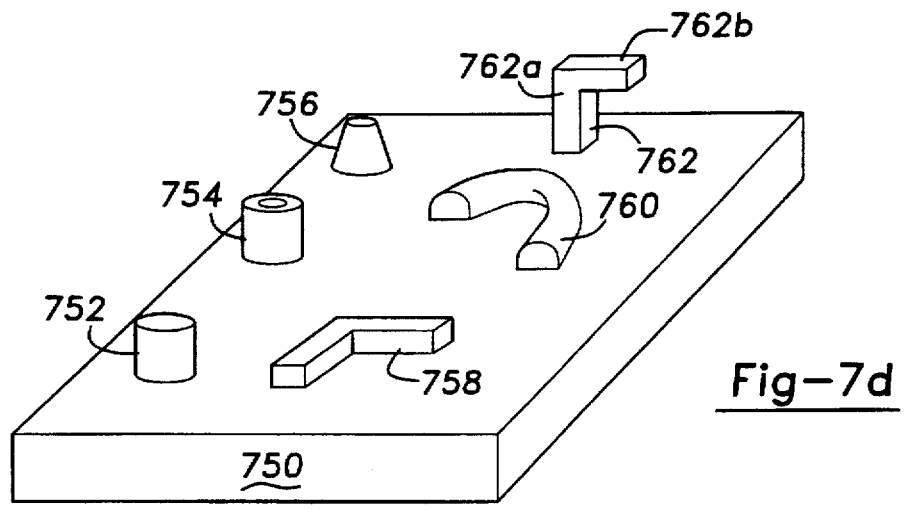
_Fig-7d_
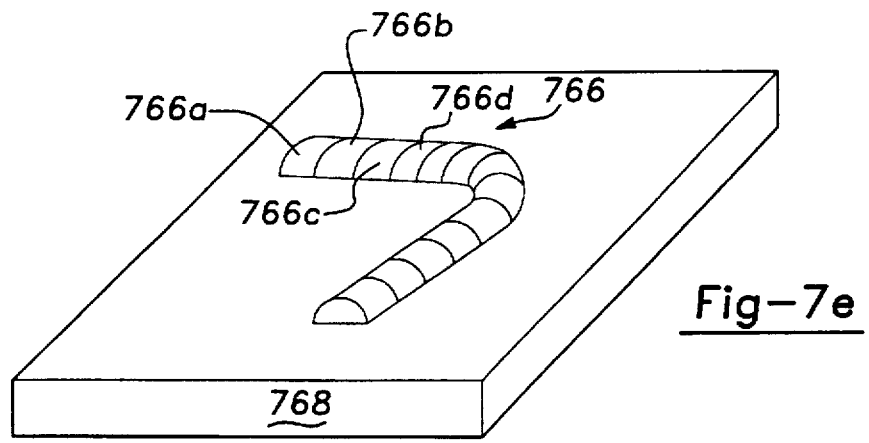
_Fig-7e_
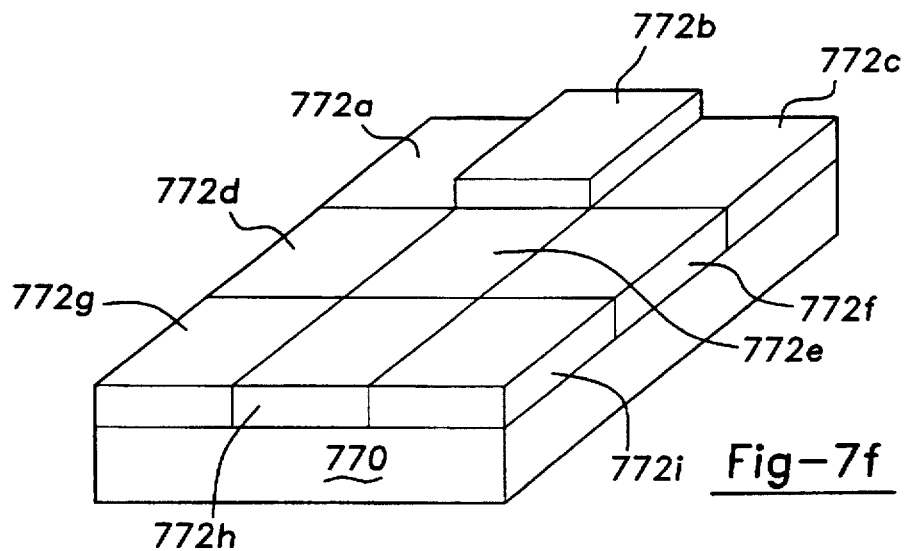
_Fig-7f_

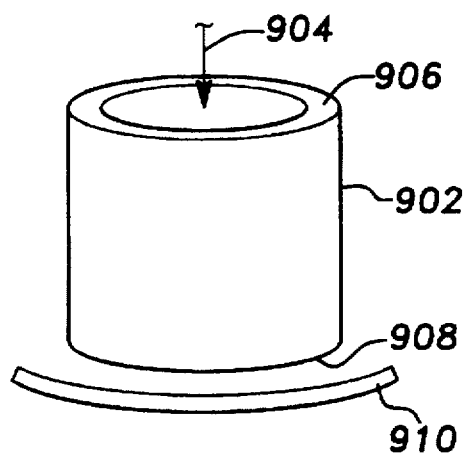
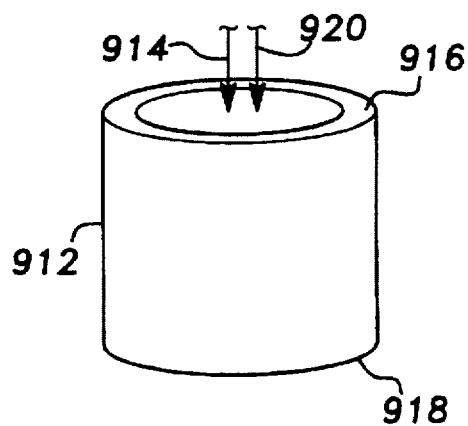
Fig-9a
Fig-9b
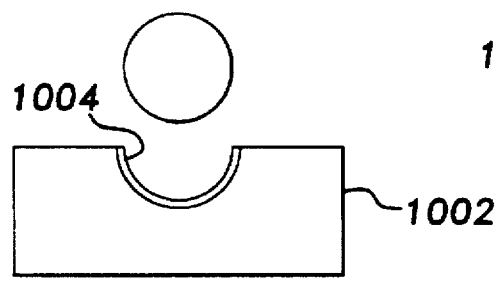
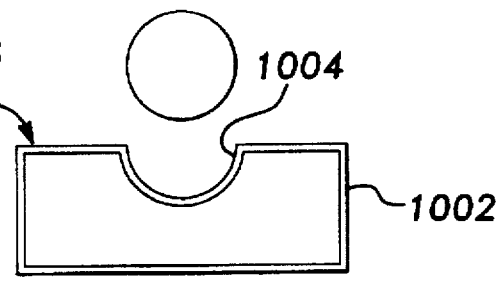
Fig-10
Fig-10a
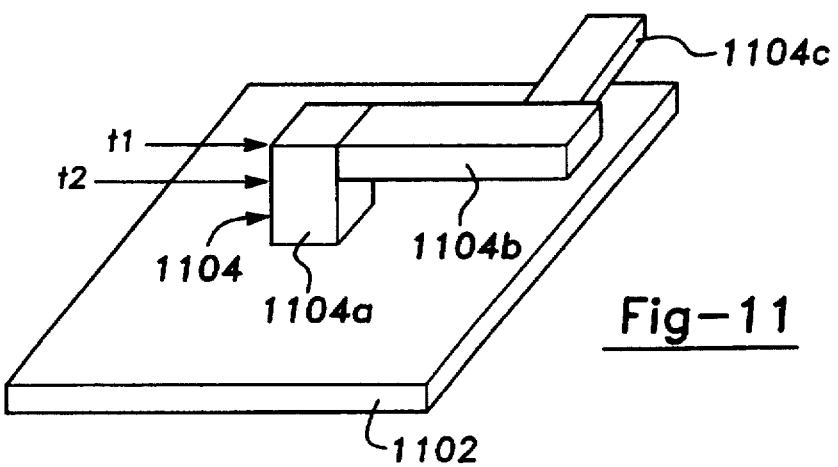
Fig-11

FABRICATION OF DIAMOND AND DIAMOND-LIKE CARBON COATINGS

CROSS-REFERENCE TO RELATED APPLICATIONS

This is a continuation-in-part of commonly-owned, U.S. patent application Ser. No. 08/182,978, filed Jan. 18, 1994 by Turchan and Mistry, now U.S. Pat. No. 5,554,415.

This is a continuation-in-part of commonly-owned, copending U.S. patent application Ser. No. 08/184,041, filed Jan. 21, 1994 by Mistry and Turchan.

TECHNICAL FIELD OF THE INVENTION

The invention relates generally to the fabrication of diamond and diamond-like carbon (DLC) coatings and, more particularly, to the fabrication of such coatings on a surface of a substrate.

BACKGROUND OF THE INVENTION

As is generally well known, applying a diamond or a diamond-like carbon (DLC) coating to a substrate may be desirable to enhance the performance or to expand the applications of the original (uncoated) substrate. As used herein, a diamond coating is a coating of carbon primarily in the sp3 phase, and a DLC coating is a coating of carbon primarily in the sp2 and sp3 phases.

One area of particular interest is the application of diamond and DLC coatings to machine tools (e.g., to machine tool cutting inserts). Diamond and DLC coatings are especially tough (hard) materials, wear well, and have thermal qualities which are beneficial in many applications. For many machining applications, the qualities of diamond or DLC are seemingly unsurpassed by any other available material.

Carbide has long been an established choice for use in cutting tools and inserts, especially for cutting (machining) ferrous, nonferrous or abrasive materials such as aluminum and its alloys, copper, brass, bronze, plastics, ceramics, titanium, fiber-reinforced composites and graphite. Various forms of carbide are known for tools and inserts, such as cobalt-consolidated tungsten carbide (WC/Co).

CVD Processes

Fabricating diamond and DLC coatings utilizing chemical vapor deposition (CVD) processes are well-known. These CVD processes, however, suffer from various shortcomings, including:

the requirement for a vacuum chamber in which to carry out the process;

the requirement of performing the process in a gaseous environment (typically methane gas, or the like);

"poisoning" of the coating when forming a diamond or DLC coating over a cobalt-containing substrate;

the requirement to preheat the substrate;

the requirement of a pressurized environment; and relatively low rates of deposition.

Certain enhancements to the CVD process have been proposed, including the use of microwave plasma enhanced (MPE) CVD process which takes place at relatively low temperatures and pressures (as compared with conventional PCD fabrication methods which utilize High Pressure and High Temperature ("HPHT") techniques. Using these processes, any insert shape can reportedly be uniformly coated, and the coated inserts can have sharp edges and chip-breaker geometries. Hence, these inserts are indexable and can provide from two-to-four cutting corners.

CVD-coated tools tend to have a relatively thin diamond layer (typically less than 0.03 mm), which tends to allow the toughness of the underlying substrate material to dominate in determining overall tool strength, even when shock-loaded. Hence, these CVD inserts tend to be able to handle a larger depth of cut (DOC).

A critical concern with any coated tool or insert is that the coating should exhibit good adhesion to the underlying base material (e.g., carbide). Concerns with the prior art include:

delamination (catastrophic failure);

adhesive and abrasive wear resistance (diamond is often used as a milestone for evaluating wear resistance);

toughness (carbide is often used as a milestone for evaluating toughness);

flank wear;

Built Up Edge (BUE) heat; and edge integrity.

The coating should also be compatible with the material contemplated to be machined. For example, polycrystalline diamond coatings tend to have a very low corrosion resistance to the resins in certain composite plastics.

Another area of concern with respect to diamond or DLC coatings on tools is that a very hard diamond or DLC coating on a softer tool is very prone to failure from stress.

An area of paramount concern is poor adhesion, which would appear to be a result from the reliance of prior art diamond or DLC coatings on the mechanism of molecular bonding, as well as from instabilities inherent in formation of the diamond or DLC coating.

An example of a CVD coating process is growing diamond by reacting hydrogen and a hydrocarbon gas, such as methane, in a plasma and synthesizing a diamond structure either as a coating or a free-standing blank. Carbide tools may be coated with a thin film of diamond using closed-chamber arc plasma CVD.

There are a number of basic CVD deposition processes currently in use, for depositing diamond coatings. Generally, these processes involve dissociation and ionization of hydrogen and methane precursor gases, which are then passed over and deposited onto a heated substrate.

The need to heat the substrate in order to apply the coatings is, in many ways, counterproductive. Such application of heat to the entire substrate can cause distortion of the substrate, and the loss of any temper (heat treatment) that had previously been present in the substrate.

For example, in the heated filament CVD method, a tungsten or tantalum filament is used to heat the precursor gases to about 2000° C. Substrate temperature ranges from 600°–1100° C. Using hydrogen and methane precursors, deposition rates of 1–10 μm per hour are possible.

In DC plasma CVD, a DC (direct current) arc is used to dissociate the precursor gases, and can provide higher gas volumes and velocities than other prior art processes.

Microwave CVD uses microwaves to excite the precursor gases, resulting in deposition rates of several microns per hour. Coatings deposited using this method are of very high purity, closer to pure diamond than the other techniques.

Another coating process, related to CVD, is Physical Vapor Deposition (PVD). In PVD, a target in a vacuum chamber is evaporated, as opposed to introducing a gas to the vacuum chamber with CVD. In both the CVD and PVD processes:

there is a need to significantly elevate the temperature of the substrate.

there is a significant (2–5 hour) cooling time, during which time residual precursors (gas or evaporated target materials) deposit, like snowflakes, on the surface being coated. This results in a coating which has a very rough surface, as compared to the pre-coated surface, and which typically requires post-processing to achieve a smoother surface.

when depositing a diamond or DLC coating, an amorphous coating is typically formed, containing either $SP^2$-bonded carbon or $SP^2$-bonded carbon and $SP^3$-bonded carbon, with higher concentration of hydrogen.

both CVD and PVD processes are directed to depositing a material on the surface of a substrate, and rely on molecular bonding.

PVD coatings tend to be porous. CVD coatings tend to be somewhat less porous than PVD coatings.

both CVD and PVD processes are generally limited in suitability to coating flat surfaces, or simple (non-complex geometry) round surfaces.

the size of the substrate that can be coated is limited by the size of the vacuum chamber in which the process is carried out; the size of the substrate is typically less than eight inches in diameter.

inasmuch as these processes tend to rely primarily on a precipitation-type (i.e., generally directional deposition) mechanism, the "other" side of the substrate may exhibit shadowing or uneven deposition.

Irrespective of the process involved in applying a coating to a substrate, the end-product may still provide unacceptable results. For example, applying a thin hard coating over a soft substrate will result in very poor stress distribution.

Prior art coating processes tend to be limited to forming a thin film (or layer) on a substrate. This is somewhat analogous to rain falling on a lawn and freezing. The resulting ice layer is relatively hard, but is thin, and there is an abrupt transition of hardness from the thin ice layer (coating) to the underlying grass (substrate). This will result in extremely poor stress distribution, as a result of which the thin layer of ice is subject to cracking when stress is applied. Generally, the thickness of the coating will reflect upon the stresses that build up in the coating.

CVD and PVD diamond or DLC are typically grainy, although they can be post-process finished to provide a surface of desired smoothness. However, in order to perform such post-finishing, a diamond must be employed. Further, as in any abrasive process, there will be directional scratches, albeit microscopic, evident in the final surface finish of the coating.

Diamond is a material of choice for coating tools because of its extreme hardness (9000 kg/mm$^2$) and its low coefficient of friction (0.05). However, regardless of the substrate material (e.g., cemented carbide) adhesion of diamond or DLC coatings has been a barrier to its widespread application. In the case of carbide substrates, these adhesion problems are augmented by the cobalt binder phase found in carbide tools which essentially "poisons" the diamond nucleation and growth process, resulting in formation of graphitic carbon (which is undesirable).

Attention is directed to the following U.S. Patents, incorporated by reference herein, as indicative of the state of the art of diamond coating: U.S. Pat. Nos. 5,273,790; 5,273,825; 5,271,971; and 5,270,077 ('077). The '077 patent, for example, discloses contacting a heated substrate with an excited gaseous hydrogen and hydrocarbon mixture under conditions of pressure, temperature and gas concentration which promote the growth of a diamond coating on a convex growth surface of the substrate, then separating the diamond coating from the convex growth surface, to provide a flat diamond film. The diamond coating separated from the substrate is under stress, and may require further processing for certain applications. Due to internal residual stresses, the diamond layer may also be deformed.

Generally, the prior art techniques for applying diamond or DLC coatings to a substrate (e.g., tool insert), although useful, suffer from one or more of the following limitations (a–o):

(a) The CVD or PVD deposition rate is limited to approximately 0.5 μm–10 μm per hour.

(b) The diamond or DLC coating exhibits poor adhesion (e.g., 30 kg/mm$^2$) on carbide substrates with higher cobalt content, requiring specialty substrates or other surface treatment.

(c) The processes are generally directed to the formation of amorphous DLC coatings only, containing $SP^2$ and/or $SP^3$ and non-diamond carbon phases (e.g., graphite).

(d) The CVD process requires the substrate to be heated to 450°–1000° C. (degrees Celsius), to enable coating growth and bonding, which can distort the substrate and which can add significant on-line time (e.g., 2 hrs.) to the process.

(e) The processes must be performed in a vacuum chamber, such as a belljar, which adds complexity to the process and which severely limits the size of the substrate to be coated.

(f) The part (substrate) being coated is held stationary, and selective coating can only be achieved by masking the substrate. Also, the processes are directed to forming uniform thickness coatings.

(g) Stainless steel cannot be easily coated using these processes.

(h) Steel cannot be easily coated using these processes.

(i) These processes do not work well for coating the inside diameters (ID, bore) of tubes, other than those having a relatively low length:diameter (L-to-D) ratio.

(j) Post-finishing steps are required for some applications, such as for sculpting and texturing the coatings and providing precision engineering dimensions.

(k) The processes are generally homoepitaxial.

(l) A Raman variance will be exhibited with various substrates, in proportion to the impurity of the coating. (Generally, the Raman effect is the scattering of incident light by the molecules of a transparent substance in such a way that the wavelengths of the scattered light are lengthened or shortened. More specifically, a quantum of light gives up some of its energy to a molecule and reappears as a scattered quantum with a lower frequency.)

(m) The processes are generally not well-suited to coating large surfaces, or surfaces with complex geometries.

(n) process the component by abrading, chemical etching, or other means to nucleate or seed the area to be treated; and (o) diamond separated from a substrate is under stress and may require further processing for certain applications. The diamond layer removed from the substrate may have internal stresses, and may be deformed.

These (a–o) and other limitations of the prior art are addressed by the techniques of the present invention, which do not depend upon a vacuum environment, and which do not require preheating the substrate to perform the coating. Generally, the techniques of the present invention are not dependent on CVD or PVD processes, and the results obtained are superior in many respects to those processes. The techniques of the present invention may be used either alone, or to enhance prior art processes.

Laser Processes

Attention is directed to the following U.S. Patents, incorporated by reference herein, as representative of processes utilizing lasers to form, or to assist in forming, diamond or DLC coatings, crystals, or structures:

U.S. Pat. No. 5,273,788 (Dec. 28, 1993), which discloses a layer of a hydrocarbon molecule applied to a substrate by the Langmuir-Blodgett technique, and the surface is irradiated with a laser to decompose the layer of molecules at the surface without influencing the substrate;

U.S. Pat. No. 5,236,545 (Aug. 17, 1993), which discloses a process involving the deposition of a cubic boron nitride (CBN) layer on a silicon substrate as a first interfacial layer using laser ablation with a hexagonal boron nitride target in a nitrogen-containing atmosphere., followed by a second interfacial layer of hydrogen terminated carbon which is deposited with laser ablation with a carbon target in the presence of atomic hydrogen, followed by deposition of a heteroepitaxial diamond film using convention al chemical vapor deposition (CVD) technique;

U.S. Pat. No. 5,176,788 (Jan. 5, 1993), which discloses the use of pulsed laser light to join diamond structures together. The process includes forming a layer of opaque non-diamond material between the two diamond surfaces to be joined, pressing the diamond surfaces together, using the pulsed laser light to quickly melt all the opaque nondiamond carbon material before a significant amount of heat is lost through the diamond surface, then allowing the resulting carbon melt to cool and solidify as polycrystalline diamond which grows homoepitaxially from the diamond surfaces, bonding those surfaces together;

U.S. Pat. No. 5,154,945 (Oct. 13, 1992), which discloses the use of infrared lasers to deposit diamond thin films onto a substrate. In one embodiment, the deposition of the film is from a gas mixture of $CH_4$ and $H_2$ that is introduced into a CVD chamber and caused to flow over the surface of the substrate to be coasted while the laser is directed onto the surface. In another embodiment, pure carbon in the form of soot is delivered onto the surface to be coated and the laser beam is directed onto the surface in an atmosphere that prevents the carbon from being burned to $CO_2$;

U.S. Pat. No. 5,098,737 (Mar. 24, 1992), which discloses directing a laser beam at a target at non-perpendicular angles of incidence. This patent provides a useful background on the four major methods being investigated for producing diamond-like carbon films: (1) ion beam deposition, (2) chemical vapor deposition, (3) plasma enhanced chemical vapor deposition, and (4) sputter deposition. Broadly speaking, this patent discloses a laser directed within a vacuum chamber to impinge upon a continuous sheet of moving target material made of graphite foil placed within the chamber. The laser beam is focused upon the target material to ablate and to eject a plume of carbon vapor, whereby the plume is partially ionized by the laser beam;

U.S. Pat. No. 5,094,915 (Mar. 10, 1992), which discloses a method for forming a carbon film on a substrate by irradiating a carbon monoxide containing gas with an emission from carbon monoxide laser without irradiating the substrate with the laser emission;

U.S. Pat. No. 5,080,752 (Jan. 14, 1992), which discloses a process in which particles of transparent diamond powders are bonded together by polycrystalline diamond to form useful diamond structures. An intimate mixture of fine opaque nondiamond carbon powder and transparent diamond powder is pressed together to form a green body that is confined in either a thin walled transparent quartz vessel or a polycrystalline diamond coating, and a pulse laser is used to quickly melt the opaque nondiamond carbon powder. Then, the carbon melt is allowed to cool and grow homoepitaxially from the surfaces of the diamond particles, producing a polycrystalline diamond that bonds the diamond particles together;

U.S. Pat. No. 5,066,515 (Nov. 19, 1991), which discloses a method of forming an artificial diamond comprising applying a laser beam to a glassy solid carbon material while moving a point on the glassy solid carbon material at which the laser beam is applied, to form a locally fused portion thereon, whereby every part of the locally fused portion is cooled as the point moves away therefrom. During cooling of the locally fused portion, an artificial diamond is formed in adjacent regions on both sides of the solidified locally fused portion;

U.S. Pat. No. 4,987,007 (Jan. 22, 1991), which discloses producing a layer of material pm a substrate by extracting ions from a laser ablation plume in a vacuum environment. The apparatus includes a vacuum chamber containing a target material and a laser focused on the target to ablate the material and ionize a portion of the ablation plume, and is suitable for forming diamond-like carbon films on a clean, unseeded silicone substrate;

U.S. Pat. No. 4,986,214 (Jan. 22, 1991), which discloses a thin-film forming apparatus capable of forming thin diamond films. The process is a laser CVD process in which thin-film forming gases are optically dissociated by high energy photons released form an ultraviolet laser beam.;

U.S. Pat. No. 4,981,717 (Jan. 1, 1991), which discloses generating a plasma by a laser pulse. The pulse is fired into a gas and is absorbed in an initiater mixed with the gas. The resulting detonation produces a plasma of ions, radicals, molecular fragments and electrons which is propelled by the detonation pressure wave to a substrate and deposited thereon;

U.S. Pat. No. 4,954,365 (Sep. 4, 1990), which discloses preparing a thin diamond film by immersing a substrate in a liquid containing carbon and hydrogen, and then subjecting the substrate to at least one laser pulse;

U.S. Pat. No. 4,948,629 (Aug. 14, 1990), which discloses depositing diamond films by CVD using a high powered pulsed laser and a vapor which is an aliphatic carboxylic acid or an aromatic carboxylic anhydride;

U.S. Pat. No. 4,874,596 (Oct. 17, 1989), which discloses directing an intense radiation beam into a cavity supporting a small quantity of material to be reacted on. Two or more intense radiation beams, such as generated by one or more lasers or electron guns, are directed against a particle or pellet of material from opposite directions, causing shock waves which collapse against the pellet material, transforming it into another form. The pellet or particles may comprise carbon, which is converted to diamond by the intense heat and force of the shock wave(s); and U.S. Pat. No. 4,849,199 (Jul. 18, 1989), which discloses suppressing the growth of graphite and other non-diamond carbon species during the low pressure deposition of carbon to form diamond. The graphite or other non-diamond species is vaporized using incident radiative energy sufficient to vaporize graphite but insufficient to damage the substrate. The growth of graphite and other non-diamond species is suppressed during deposition of diamond by exposing growing surfaces to incident radiative energy of a wavelength sufficient to selectively photolyze non-diamond carbon-carbon bonds formed at the surface of the growing diamond;

U.S. Pat. No. 4,522,680 (Jan. 11, 1985), which discloses a method of producing diamond crystals comprising providing a pressure-resistant body having a nucleus of a starting material being crystallized in the inside thereof. The nucleus is applied with an energy which is capable of passing through the pressure-resistant body and being absorbed by the starting material, by which the nucleus is heated and melts. The melt is then gradually cooled under pressure to form crystals. A laser beam or high frequency induction heating technique is used for heating the nucleus.

These processes fall short of meeting the objectives of the present invention in various ways. For example:

U.S. Pat. No. 5,273,788, entitled PREPARATION OF DIAMOND AND DIAMOND-LIKE THIN FILMS, incorporated by reference herein. This patent discloses a method for forming a DLC film on a substrate, and generally involves the steps of depositing a Langmuir-Blodgett (LB) molecular layer of a molecule containing carbon and hydrogen on the surface of the substrate, and irradiating the molecular layer with a laser beam sufficient to reform bonds between carbon atoms in the molecular layer, so as to form a DLC film on the substrate. The Langmuir-Blodgett (LB) technique involves forming one or more molecular layers in an ordered array consisting of surfactant-type organic molecules with a hydrophilic polar head group and a hydrophobic tail. It is represented in this patent that the laser irradiates and carbonizes the LB layer (decomposes the organic molecules in the LB layer), "but has little or no effect on the substrate (itself)". The laser power and time of irradiation is chosen to induce rebonding of the carbon atoms in the LB layer and achieve formation of a DLC film on the substrate. The process of this patent permits the formation of DLC films without a vacuum chamber, and the DLC films may contain minor amounts of other elements or substances that do not interfere with the formation or function of the DLC film, such as oxygen from air that is bonded to the carbon during irradiation. This patent makes reference to other techniques for forming diamond films by immersing a substrate in a fluid medium comprising a carbon-containing precursor and irradiating the substrate with a laser to pyrolize the precursor. One example that is given is a process (U.S. Pat. No. 4,948,629) for the deposition of diamond films where gas containing an aliphatic acid or an aromatic carboxylic anhydride that vaporizes without decomposition is passed over a substrate and irradiated with a focused, high-powered, pulsed laser. Another example that is given is a process (U.S. Pat. No. 4,954,365) where the substrate is immersed in a liquid containing carbon and hydrogen (e.g., methanol), a laser pulse is directed through the liquid coating to heat the substrate, the liquid is pyrolized, and carbon material from the pyrolized liquid grows on the substrate to form a diamond coating on the substrate. Additional examples of processes employing lasers to form diamond films are set forth in this patent, which is primarily directed to pyrolizing a LB layer as a precursor to a completely reformed film.

U.S. Pat. No. 4,849,199, incorporated by reference herein, discloses a method for suppressing growth of graphite and other non-diamond carbon species during formation of synthetic diamond. As is noted in the patent, high pressure processes for synthesizing diamond all tend to suffer from the growth of graphite, which eventually causes diamond growth to cease. A low pressure method is disclosed in the patent whereby growth of graphite and other non-diamond carbon species is suppressed by evaporation or selective photolysis. In one method disclosed in the patent, the graphite or other non-diamond carbon species is vaporized using incident radiant energy sufficient to vaporize graphite but insufficient to damage the substrate. In another method disclosed in the patent, the graphite or other non-diamond carbon species is selectively photolyzed, such as, by the use of laser energy of appropriate wavelength. The methods of the patent are intended to function in conjunction with a plasma enhanced chemical vapor deposition process (PECVD) to grow diamonds on seed crystals, requiring a carbon source gas. The use of a laser is suggested to vaporize the graphite and non-diamond carbon species as they form upon the diamond growing surface, with the caveat that the laser energy should be low enough to avoid any substantial physical or chemical damage to the substrate, particularly if the substrate is other than a diamond seed crystal. It is further suggested in the patent that control of graphite growth over a large diamond crystal or substrate area may be achieved by scanning a tightly focused beam over the entire area.

U.S. Pat. No. 4,987,007, incorporated by reference herein, discloses a method and apparatus for producing a layer of material from a laser ion source. The process is intended for use in a vacuum environment, and can produce a DLC layer of exhibiting uniform thickness with less than 3% variation at a rate of 20 μm per hour. The process involves focusing a laser beam on a target, ablating a portion of the target to eject a plasma of the target substance, ionizing part of the plasma with the laser, and positioning a substrate to collect the ions to form a layer of material on the substrate.

What is needed is a method and apparatus for commercially and economically treating and/or fabricating objects to obtain a desired composite material. Furthermore, it is desirable to improve the deposition rate, bond strength, adhesion, process time, area of growth, and material strength. Furthermore, it is desirable to produce an object having a desired composite material so as to permit effective engineering evaluation of material strength and production of parts and produce parts that exhibit surfaces having precise dimensions according to engineering data.

Attention is further directed to the following U.S. patents, incorporated by reference herein for the purpose of providing general background information on processes of various kinds utilizing a laser: U.S. Pat. No. 4,892,751 (METHOD AND APPARATUS FOR FORMING A THIN FILM); U.S. Pat. No. 4,681,640 (LASER-INDUCED CHEMICAL VAPOR DEPOSITION OF GERMANIUM AND DOPED-GERMANIUM FILMS); U.S. Pat. No. 4,892,751 (METHOD OR AND APPARATUS FOR FORMING A THIN FILM); U.S. Pat. No. 5,017,317 (GAS PHASE SELECTIVE BEAM DEPOSITION); U.S. Pat. Nos. 5,080,753 and 5,139,591 (LASER DEPOSITION OF CRYSTALLINE BORON NITRIDE FILMS); U.S. Pat. No. 5,096,740 (PRODUCTION OF CUBIC BORON NITRIDE FILMS BY LASER DEPOSITION), and U.S. Pat. No. 4,701,592 (LASER ASSISTED DEPOSITION AND ANNEALING).

SUMMARY OF THE INVENTION

It is therefore an object of the present invention to provide an improved technique for fabricating diamond and diamond-like carbon coatings on a substrate.

It is a further object of the present invention to provide a technique for forming diamond and diamond-like carbon coatings on substrates of various compositions (e.g., steel, stainless steel, carbide steel), which coatings exhibit superior adhesion to the substrate, as well as relatively great thickness and rate of fabrication.

It is a further object of the present invention to provide a technique for fabricating a diamond or diamond-like carbon coating on a substrate using a process that may be carried out in an ambient (non-vacuum) environment, or in a vacuum environment.

It is a further object of the present invention to provide a technique for fabricating a diamond or diamond-like carbon coating on a substrate without heating (or pre-heating) the entire substrate, while controlling the thermal balance of the fabrication process, and without adversely affecting the entire mass of the substrate.

It is a further object of the present invention to provide a technique for continuously forming a diamond or diamond-like carbon coating on a substrate.

It is a further object of the present invention to provide a technique for fabricating a diffusion-bonded diamond or diamond-like carbon coating on a substrate.

It is a further object of the present invention to provide a technique for fabricating a diamond or diamond-like carbon coating on a substrate containing a significant amount of cobalt.

It is a further object of the present invention to provide a technique for fabricating a diamond or diamond-like coating on a substrate of all steel alloys, including stainless steels, and carbide steels.

It is a further object of the present invention to provide a technique for fabricating a diamond or diamond-like carbon coating on an inside surface of a tubular substrate having a high (e.g., greater than 3:1) length (L) to diameter (D) (L:D) ratio.

It is a further object of the present invention to provide a technique for fabricating a diamond or diamond-like carbon coating on a substrate in a manner which does not require post-process finishing.

It is a further object of the present invention to provide a technique for fabricating a diamond or diamond-like carbon coating on a substrate in a truly heteroepitaxial manner.

It is a further object of the present invention to provide a technique for fabricating diamond or diamond-like carbon coatings on substrates having complex geometry.

It is a further object of the present invention to provide a technique for fabricating a diamond or diamond-like carbon coating on a tool or insert, especially a cutting tool.

It is a further object of the present invention to provide a technique for coating a tool or insert, especially a cutting tool, especially with diamond and DLC coatings, in a manner that is robust with respect to carbide, even with relatively high cobalt concentrations, as well as with high speed steel alloys and other cutting tool materials, and in a manner that can be performed at low temperatures and pressures.

It is a further object of the present invention to provide a technique for improving the adhesion of a diamond or DLC coating to a substrate, in a manner that is robust with respect to carbide, and in a manner that can be performed at low temperatures and pressures.

It is a further object of the present invention to provide a technique for fabricating a diamond or diamond-like carbon coating on a substrate in a manner that will provide a diffusion bonded carbonaceous composite material below the surface of the substrate.

It is a further object of the present invention to provide a technique for treatment and fabrication of materials to produce an object having a diamond or DLC surface.

It is a further object of the present invention to provide a system for treating objects to have a diamond or DLC surface.

It is a further object of the present invention to provide a system for fabricating diamond or DLC coatings which is amenable to Computer Numerical Control (CNC) processes which accept files to facilitate the fabrication of said coatings.

It is a further object of the present invention to provide a technique for fabricating diamond and DLC coatings in a manner that does not require post-process finishing.

According to the invention, laser energy is brought to bear upon (directed at) a surface of a substrate, to drive a reaction system comprising one or more of the following process flow steps (A–I).

An important feature of the invention is that a carbonaceous element (e.g., carbon) within the substrate itself is used as a "primary" source of native material for forming a diamond or DLC coating on the substrate, without necessitating introducing additional material (elements) from a "secondary source". This has the ancillary effect of creating a region within the substrate itself for diffusion bonding a diamond or DLC coating fabricated on the surface of the substrate. As will be evident, employing a secondary source to augment the fabrication of a diamond or DLC coating on the substrate can be beneficial.

In a first process step (Step A), laser energy is utilized to mobilize a carbonaceous (e.g., carbon) constituent element in a sub-surface region of the substrate, and moving the constituent element towards the surface of the substrate. This produces a higher concentration of the constituent element in a sub-surface region of the substrate. (By extracting constituent elements, the substrate can be considered to have been altered, or rarified, with respect to the mobilized and vaporized constituent element.)

The laser energy is also utilized to vaporize and react the constituent element in a preliminary gas reaction (PGR) in a reaction zone (RZ) above the substrate, to modify the physical structure and properties of the vaporized constituent element (e.g., to modify carbon to a diamond or DLC phase). This produces what is termed a "composite material", which is diffused (by the laser energy) back into the substrate. The composite material provides a modified layer, within the substrate, useful in and of itself, and also useful for diffusion bonding a subsequent diamond or DLC coating fabricated on the substrate.

The process can be stopped (see Step H), or can continue (see Step B).

In a process Step B, the composite material is diffused into the surface of the substrate creating a "conversion zone" (CZ) below the surface of the substrate. This is essentially a process of passive diffusion from a greater concentration in the PGR (RZ) to a lesser concentration of composite material in the conversion zone. The process next proceeds in one of two directions (Steps C and D).

In a process Step C, the process can be stopped, having successfully formed a conversion zone with a concentration of composite material in the substrate. For example, the conversion zone may be diamond or DLC enhanced material composition whereby the physical volume of the original object may not be affected.

Alternatively, in a process Step D, the conversion zone (CZ) can further be treated by repeating the steps of mobilizing, vaporizing and reacting (similar to Step A) the composite material within the conversion zone, or mobilizing, vaporizing and reacting the one or more of the constituent elements from the substrate, or both. In the case of further treating the composite material within the conversion zone, the process acquires synergy and will proceed at a greatly increased rate (e.g. exponentially). This process is iterated to achieve practically any desired concentration of composite material at the surface of the substrate, and practically any desired gradient of composite material within the conversion zone.

At this point in the process, a diamond or DLC coating (fabricated material) can be produced on the surface of the substrate. To fabricate the coating material, a secondary source may (Step E) or may not (Step F) be introduced to the system.

In a process Step E, a "secondary" source (the substrate itself is considered the "primary" source) is activated to provide carbonaceous (carbon-containing) "secondary" elements to the reaction zone. The laser energy source is used, in this case, to fabricate a synthesized diamond or DLC coating composition on the surface of the substrate. The synthesized coating composition is a fabricated structure containing both the one or more secondary elements and the composite material.

Immediately below the surface of the substrate there will be a secondary conversion zone having a relatively small depth (as compared with the (primary conversion zone) and a greater concentration of the one or more secondary elements than are present in the primary conversion zone. The secondary conversion zone, in conjunction with the primary conversion zone, provides an important function vis-a-vis bonding, support and stress distribution for subsequent fabrication of a diamond or DLC coating on the substrate. The conversion zone (primary and secondary) has an overall influence in defining the parameters required for bonding, support and stress distribution for a subsequent diamond or DLC coating (if any) fabricated on the substrate. Depending on the application, it is possible to have more than one conversion zones. In this manner, a conversion zone having a depth "d" can be formed below the surface of the substrate, and a diamond or DLC coating material of thickness "t" can be fabricated on the surface of the substrate).

For example, to fabricate an approximately 3 mm thick layer (coating) of diamond (or DLC) on a steel or cemented carbide substrate, the primary conversion zone could be approximately 0.75 mm deep, and the secondary conversion zone could be approximately 0.25 mm thick.

In a process Step F, wherein a secondary source is not introduced to the system, a small amount of the composite material from the conversion zone is mobilized, vaporized and reacted (in a manner similar to the Step A) to form a secondary conversion zone below the substrate (in a manner similar to which a secondary conversion zone was formed in the Step E), which can further be reacted (by the energy source) to form a diamond or DLC coating on the substrate. This results in a diamond or DLC coating being fabricated on the substrate which may be thinner than the coating that was fabricated using a secondary source (Step E).

It is, however, entirely possible that there will be a sufficient amount of constituent element available in the substrate itself to fabricate a relatively thick coating on the surface of the substrate in the Step F.

For example, using a substrate of tungsten-carbide (e.g., 92%) in a cobalt matrix, the laser energy source will cause the tungsten and the carbide to disassociate into tungsten and carbon, and the carbon can provide a "native" source (i.e., carbonaceous constituent element) for fabricating a diamond or DLC coating on the substrate. Additionally, dissolved carbon in the cobalt matrix also provides a "native" source of carbon for the fabrication of diamond or DLC coating.

This process of the present invention is superior to prior art CVD (and PVD) processes in that in those processes, cobalt will exhibit an undesirable graphite-forming influence in the system which will "poison" the system and inhibit the formation of a diamond or DLC coating.

Using the technique of the present invention, any graphite formed in the process will continuously be converted into the subsequent diamond or DLC coating. Preferably, all of the available graphite is consumed by the process. However, it is not destructive of the process if a small amount of graphite remains unconverted into diamond or DLC.

In a process Step G, as a diamond or DLC coating is fabricated on the substrate, a different secondary source having different one or more carbonaceous secondary elements can be introduced to the reaction system. This will result in a multi-layer coating being fabricated on the substrate.

For example, starting with a tungsten carbide substrate, an overlying coating (layer) of DLC can be fabricated, over which a layer of diamond can be fabricated, simply by sequencing the introduction of secondary elements into the reaction system.

As shown by process Step H, it may be desirable in some instances to avoid (or minimize) diffusing the composite material back into the substrate (see Step B), in which case the process can be stopped after mobilizing, vaporizing and reacting the one or more constituent elements of the substrate in the Step A. This is advantageous for fabricating a very thin coating on the surface of the substrate, if desired.

For example, it may be desired to form a thin coating of diamond or DLC on the surface of a substrate (e.g., a copper wire), or below the surface of the substrate, without affecting the original physical volume of the substrate.

For example, material compositions of selected areas or the entire area of ball or roller bearing tracks or races may be enhanced without affecting their physical volume.

It is also possible that the process flow can proceed directly from the initial mobilizing, vaporizing and reacting (Step A) to the step (Step E) of introducing a secondary source to the reaction system. (This "bypass route" is shown as a process Step I).

For example, in order to grow (synthesize) diamond or DLC on a substrate which does not contain carbon (i.e., which has no primary source of carbon at all), it may be necessary to introduce carbon as a secondary element to the system, since it is not available as a constituent element. The step of mobilizing, vaporizing and reacting the titanium from the substrate will serve to form a diffusion bonding with the subsequently fabricated diamond or DLC coating.

According to a feature of the invention, the laser energy driving the reaction system may be a narrow (controlled cross-section) beam directed at selected areas of the substrate, and can be scanned in any pattern on the surface of the substrate, to fabricate any desired "profile" (e.g., composition, thickness, shape) or pattern of coatings on the substrate. The laser beams may be focused, or de-focused. Each of these selected areas may be considered to be a selected reaction zone immediately above the surface of the substrate (or immediately above the surface of a coating fabricated on the substrate, or upon a previously-formed coating).

According to a feature of the invention, selected areas of the substrate are suitably treated with at least one laser which has a controllable beam. By "selected areas" it is meant that an area substantially less than the entire surface area of the substrate can be treated, without treating the remainder of the surface. It will be understood, however, that a sequence of selected areas can be treated, in a serial or parallel manner, up to and including treating the entire surface (or surfaces) of the substrate.

In a preferred embodiment of the invention, the energy directed at the substrate is provided by three lasers, each operating with particular (selected) parameters of:

wavelength ($L_1$, $L_2$, $L_3$);

mode (e.g., pulsed, super-pulsed or continuous wave), including pulse width and frequency;

output power (P1, P2, P3); and energy (J1, J2, J3).

Depending on the activity performed during the process of the present invention, each of the above parameters may be configured so as to enable unprecedented control of the treatment of the of the object. For example, a CNC control station will have predetermined configurations for a desired treatment. In this manner, the wavelength, mode, output power, and energy, as well as other elements which may be used (e.g., optics, secondary source, positioning mechanism, focusing mechanism), may be configured and controlled to achieve the desired treatment. Thus, depending on the desired treatment, each of these lasers, and other elements, may have predetermined configurations defining respective parameters. Also, these parameters may be configured to achieve any desired treatment at any moment of time or process in steps mentioned in FIG. 1.

According to the invention, the operating parameters of the lasers are selected according to the treatment sought to be performed on a substrate of any given composition.

In an exemplary embodiment of the invention:

a first of the three lasers is a pulsed excimer laser, operating at either 192 nm, 248 nm, or 308 nm, with a power output of tens of (0–200) watts (W), with a pulse energy of up to 500 mJ (millijoules), a pulse length of up to 26 nanoseconds (ns), and a repetition rate of up to 300 Hz (Hertz);

a second of the three lasers is a Nd:YAG laser, operating at 1.06 microns in a continuous (CW) or burst mode, or Q-switch with a power output of hundreds of (0–1500) watts, with a pulse energy of up to 150 J (Joules), a pulse frequency of up to 1000 Hz, a pulse length of up to 20 milliseconds (ms), and (in a pulse/burst mode) a pulse stream duration of up to 5 seconds;

a third of the three lasers is a $CO_2$ laser operating at a wavelength 10.6 microns, with a output power on the order of 500–10000 W, a pulse frequency up to 25 KHz, a pulse up to 25 microseconds, a super-pulse frequency up to 20 KHz, and a super-pulse width up to 500 microseconds.

In an exemplary application of the substrate treatment technique (steps A, B, D, and E above) of the present invention:

the substrate is carbon steel;

the constituent element is carbon;

the secondary element, if utilized, contains carbon (e.g., carbon monoxide, carbon dioxide), depending on the treatment, coating thickness desired, and whether the substrate is high carbon steel or low carbon steel;

the resulting conversion zone depth "d" is approximately 1.0 mm (including an approximately 0.25 mm secondary conversion zone); and;

the resulting diamond or DLC coating thickness "t" is approximately 3 mm (or approximately three times the depth of the conversion zone).

According to a feature of the invention, the energy directed at the substrate can advantageously be employed to cause (or to control) physical stresses in the diamond or DLC coating being fabricated, and that by advertently inducing such stresses, crystalline growth may be controlled (accelerated) to substantially increase the growth rates over the prior art.

According to a feature of the invention, the energy directed at the substrate can advantageously be employed to achieve any desired topography (texture) on the surface of the substrate, either as a final result, or to prepare the surface for a subsequent coating. An important feature of the present invention is that the laser energy source (e.g., an excimer laser) can be used for surface-finishing the fabricated coating.

According to a feature of the invention, the secondary source may include a doping element as one of the secondary elements. For example, a diamond or DLC coating could be doped (with a "fugitive" species) to enhance its properties for certain applications.

In any of the process steps (STEP A–STEP I) set forth above, the substrate may optionally be electrically biassed (caused to have a higher or lower electrical potential than its surroundings) to control the orientation of crystal growth on the substrate, or on an already formed coating, or for any other suitable purpose.

An important feature of the invention is that the process can be carried out without a vacuum. A "shielding" gas, such as argon may be, but is not required, introduced into the system, depending on the treatment.

The process can also be carried out in a vacuum, and can incorporate many of the same steps that are involved in a CVD (or PVD) process. For example, rather than heating the entire substrate to drive a deposition reaction (as is typically required in CVD processes), the laser energy can be brought to bear upon (directed at) selected areas of the substrate, and can be scanned in any pattern on the surface of the substrate, to fabricate any desired "profile" (e.g., composition, thickness, shape) or pattern of diamond or DLC coatings on the substrate. This will avoid many of the problems associated with heating the entire substrate, and will provide for results that are not otherwise obtainable with CVD or PVD processes (without masking the substrate).

Further according to the invention, the substrate (workpiece) is moved relative to the energy sources, or vice-versa, in order that the depth of the conversion zone and the thickness of the coating can be controlled, from location-to-location across the surface of the substrate. In many applications, a coating of uniform thickness across the entire area of a surface of a substrate will be required.

Further according to the invention, the depth "d" of the conversion zone can be controlled to a selected depth, by selecting any or all of the following: intensity, duration, and incident angle of the laser energy source(s).

Further according to the invention, the laser energy source (s) and the secondary source can be controlled during the process of treating the substrate so that a layered coating, each having desired composite material, can be fabricated. Since the coating may be progressively fabricated, the laser energy source(s) and the secondary source may be controlled so as to achieve a multi-composition (e.g., multi-carbon-phase) fabrication. Also, the process may continuously create subsequent conversion zones having desired composition material to achieve the desired coating.

The present invention exhibits several advantages over existing coating techniques, including:

providing a continuous reaction system at selected (discrete) areas of the substrate a fabricated diamond or DLC composition may be either "truly heteroepitaxial" and/or homoepitaxial; for example, a fabricated heteroepitaxial fabricated composition may develop into a homoepitaxial fabricated composition (e.g., the coating, or a subsequent coating when the composition is $SP^3$ carbon-bonded). The techniques of the present invention allow for growth of a diamond or DLC material on another underlying material without limitation as to crystal orientation, lattice structure, direction of growth, materials, etc. In other words, the material being fabricated is not limited (unrestrained) by properties of the material or substrate upon which it is being fabricated.

any lattice structure may be formed as a diamond or DLC coating on the surface by choosing an appropriate nucleation material and causing an appropriate species in the material of the substrate to enter the Preliminary Vapor Phase (PVP);

the process may be performed without CVD processes, without a vacuum, and without a target material;

the process may be performed in ambient atmospheric conditions;

the process may be performed without preheating the substrate;

the process is continuous, and allows a composition of any desired depth to be formed below the surface of the substrate, and a diamond or DLC composition of any desired thickness to be formed on and above the surface of the substrate;

the bonding is deeper and provides for greater adhesion than the prior art.

the diamond or DLC coating can be formed on a substrate of virtually any size and shape, including very large substrates. There is virtually no limit to the thickness or area of composition formed by the process; and treating a substrate to form a diamond or DLC surface maybe accomplished without affecting the original physical volume of the substrate.

The present invention exhibits several advantages over present PVD, thin-film and CVD techniques for diamond coating tools, including:

better adhesion;

efficiently achieve greater thickness with growth rates on the order of that achieved by high-pressure, high-temperature (HPHT) processes;

The laser energy source is preferably pulsed, but can be continuous wave (CW).

Optics may be interposed between the lasers and the surface of the substrate so that the beams emitted by the lasers are either focused or diffused or otherwise altered.

The secondary element is introduced into the reaction system by any of a number of known means, such as by spraying, dispersing, depositing, ablating, or by any other known means, and may be in the any suitable form such as a liquid, a gas, a solid, a plasma, a powder, or the like.

For example, a gaseous secondary element may be introduced into the reaction system using a pressurized nozzle (jet) that is designed to deliver the gaseous secondary element in an envelope of another (e.g., inert) gas which will focus (direct) the delivery of the secondary element by helically-controlled swirling of the gases exiting the nozzle (jet). In this manner, the secondary element can be directed to the same selected area of the substrate as the incident laser energy beam(s).

According to a feature of the invention, the gaseous secondary element and the enveloping gas can both serve as secondary elements in the reaction.

According to a feature of the invention, gases can be introduced both for shielding (another secondary element) or for augmenting the reaction (of another secondary element).

A target, such as a graphite carbon-source, may be contained outside of or within the nozzle (jet) and may be irradiated by an energy source (e.g., a laser) and subsequently introduced into the reaction system.

The secondary element may also be selected to serve as a "shield" (from the environment, without necessitating the use of a vacuum) for the process when a secondary source is not needed (see, e.g., Step C, F and H in the process flow, described hereinabove), in which case the secondary element (and the enveloping gas) may be a clean or inert gas.

According to conventional usage, growth of a material upon itself, while retaining the crystalline nature of the underlying substrate is called "homoepitaxy". Growth of a dissimilar material onto a substrate, while retaining the crystal orientation of the substrate is called "heteroepitaxy". As used herein, the term "truly heteroepitaxial" is used to convey the notion of synthesizing a material (i.e., a diamond or DLC coating) on an underlying, dissimilar material, irrespective of crystal orientation, and is intended to distinguish over systems (such as CVD or PVD systems) requiring seeding of the material or otherwise providing nucleation sites to be synthesized, which are considered to be "homoepitaxial".

The techniques of the present invention are useful for fabricating diamond or DLC coatings on virtually any size or shape substrate, such as tool inserts, large flat sheets, large formed sheets, piston rings, cylinder liners, spray nozzles, gun barrels, valve seats, and the like.

The techniques of the present invention are useful for fabricating diamond or DLC coatings on substrates of virtually any material composition, including superconductive materials.

The techniques of the present invention are truly heteroepitaxial, allowing for a diamond or DLC coating to be fabricated in virtually any orientation on the surface of a substrate or previously formed coating.

The techniques of the present invention facilitate the creation of a conversion zone below the surface of a substrate, and the conversion zone can function as a robust support for enhanced diffusion bonding of a diamond or DLC coating fabricated on the substrate.

Vis-a-vis a diamond or DLC coating fabricated on the surface of the substrate, the techniques of the present invention facilitate the formation of such a coating at rates and at thicknesses which cannot be achieved using prior art coating processes. For example, a diamond or DLC coating can be fabricated at a rates exceeding 100 μm per hour, including in excess of 1 mm per minute, 3 mm per minute and 10 mm per minute. Coatings with final thicknesses (t) exceeding 100 μm, including in excess of 1 mm, 3 mm and 10 mm can be fabricated.

Vis-a-vis the treatment of a substrate to form a conversion zone of composite material, the techniques of the present invention facilitate the formation of such a conversion zone at rates and at depths exceeding 30 μm per hour, including in excess of 0.5 mm per minute, 1 mm per minute and 3 mm per minute. Conversion zones with final depths (d) exceeding 30 μm, including in excess of 0.5 mm, 1 mm and 3 mm can be fabricated.

The techniques of the present invention are continuous, overcoming the limitations of batch processing that are found in the prior art. Substrates having dimensions in excess of six inches, including greater than 8 inches, greater than 10 inches, greater than 30 inches, and greater than 100 inches can successfully be treated with the techniques of the present invention.

The techniques of the present invention are useful for treating a substrate to prevent corrosion, erosion and the like, and to create a chemically-inert surface on a partial area or the entire substrate.

An advantage of the low temperature (no pre-heating) techniques of the present invention is that the substrate will retain dimensional stability during treatment, and will not lose its underlying hardness (e.g., temper, in steel).

The process disclosed herein is truly heteroepitaxial, and is suitable for treating substrates of complex geometries, and coating all sides of such substrates either evenly or selectively. The process may also be used as an adjunct to conventional CVD-type processes, to eliminate the need for heating the substrate to high temperatures.

Other objects, features and advantages of the invention will become apparent in light of the following description thereof.

BRIEF DESCRIPTION OF THE DRAWINGS

FIG. 1 is process flow diagram illustrating the techniques of the present invention.

FIG. 2a is side cross-sectional view of a substrate treated by an embodiment of the techniques of the present invention.

FIG. 2b is side cross-sectional view of a substrate treated by an embodiment of the techniques of the present invention.

FIG. 6 is a schematic view of an embodiment of the present invention showing, generically, the technique of having a secondary source introduce a secondary element into the reaction system, such as for fabricating a coating on the surface of a substrate, which may be the substrate of FIGS. 5 and 5a.

FIG. 6a is a partial cross-sectional view of apparatus suitable for introducing a secondary element into the reaction system.

FIG. 7d is a schematic view of an embodiment of the invention illustrating additional shapes that can be fabricated as coating structures on the surface of a substrate.

FIG. 7e is a schematic view of an embodiment of the invention illustrating a snake-like coating.

FIG. 7f is a schematic view of an embodiment of the invention illustrating a number of coating segments formed in an array on a surface of a substrate.

FIG. 9a is a schematic view illustrating one technique for coating the ID of a tubular substrate.

FIG. 9b is a schematic view illustrating another technique for coating the ID of a tubular substrate.

FIG. 10 is a schematic view illustrate a ball bearing having the surface of its race treated to have a hard coating.

FIG. 11 is a schematic representation of a material processing system according to the present invention.

FIG. 12b is a partial cross-sectional view of a nozzle similar to that of FIG. 12a.

DETAILED DESCRIPTION OF THE INVENTION

Figure 3:
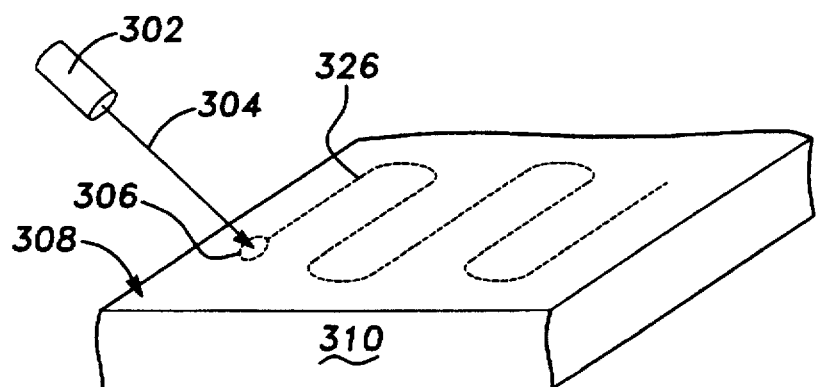
FIG. 3 is a perspective view of an embodiment of the present invention.

The following terms may be used in throughout the description:

As used herein, the term "treatment" (or "treating") includes forming (or fabricating, constructing, or enhancing) a coating (or layer) on a surface of a substrate or on a surface of previously formed coating, as well as modifying the composition of material below the surface (e.g., a sub-surface region) of the substrate.

As used herein, "substrate" may be the area of the object being treated, modified, enhanced, or fabricated.

As used herein, the term "layer" is defined by the composite material. A layer may include a conversion zone. The term "coating" is defined by the layer(s) fabricated.

As used herein, "composite material" is one or more elements that has had its (their) physical structure, including phase, altered, modified, changed, and/or that has had another one or more elements added to it. This use of the term "composite" differs from the ordinary meaning of the term and is used simply to indicate that the material has been changed in some way, as indicated in the previous sentence. In this sense, "composite" material should simply be read as "modified" material, throughout the descriptions set forth herein.

As used herein, "constituent element" is an element (e.g., carbon) of interest in either the substrate itself, or in the composite material, or in the environment relative to the substrate.

As used herein, "secondary source" means any secondary element (e.g., carbon-containing) that may be combined with constituent elements to form a composite material and/or may be used to shield the reaction zone from contamination from the environment.

As used herein, the term "diffusion bonded" (or "bonded", "bonding" or "bond") means diffusion bonding one or more constituent element(s) and/or secondary element(s) in the conversion zone.

As used herein, "conversion zone" means the area where constituent elements form a composite material and/or is the diffusion bond depth for growing (synthesizing) a subsequent layer.

The present invention effectively utilizes the principles of metallurgy and energy to not only overcome the concerns of prior art coating technology, but also to open the door for next generation manufacturing techniques. The present invention provides for unprecedented control of the treatment of existing objects, and/or fabrication of objects, to produce any desired composite material (i.e., to control the phases of the diamond or DLC coating).

The process according to the present invention operates at unprecedented rates and achieves unprecedented results, including material enhancement, material fabrication of objects having a predetermined geometry or shape, composite material thickness, and bonding. The present invention teaches material enhancement and object fabrication achieving unparalleled results relative to time (process time), cost, and capability (e.g. excellent composite material, rate of growth, bonding, etc.) related to efficiency and economic material enhancement, fabrication and manufacturing process.

Furthermore, the process is completed without adversely contaminating the enhanced material (e.g., the fabricated coating). In certain applications, any contaminated material may be utilized to form a desired composite material, thus efficiently utilizing the stabilized environment relevant to the object.

Material enhancement according to the present invention can be performed by either modifying a substrate composition to produce a desired composite material in the sub-surface region of a substrate and/or fabricating one or more layers having a desired composite material on a surface of the substrate.

The present inventive techniques are distinct from the CVD (including PVD and MEPVD) processes described hereinabove. Generally, these processes must be carried out in a vacuum, with the substrate maintained at an elevated temperature and allowed to cool down at the end of the process. Although lasers may be employed in these processes, they are typically employed for the purpose of vaporizing (evaporating) material from a target (pellet) (e.g., in PVD). In other cases, a laser is directed at the surface of the substrate itself for the purpose of converting a layer of material on the surface of the substrate, but has little or no effect on the substrate itself. Furthermore, prior art processes have demonstrated difficulties in efficiently achieving desirable material bonding and/or growth rates. The following demonstrates a process and apparatus according to the present invention which provides for enhanced material composition, including enhanced bonding and growth rate of diamond, DLC and virtually any other material.

FIG. 1 is a diagram showing an overview of various process flows for the techniques of the present invention. Generally, all of the techniques are initiated by directing laser energy at a surface of a substrate, to drive a reaction system, which is described in the process flow as Steps A–L In a first process step (Step A), the laser energy mobilizes one or more carbonaceous (e.g., carbon-containing) constituent elements in a sub-surface zone of the substrate, at corresponding one or more rates, and moves the one or more carbonaceous constituent elements towards the surface of the substrate to produce a concentration gradient of the one or more carbonaceous constituent elements in the sub-surface zone; separate and vaporize selected amounts of a selected portion of the one or more constituent elements in a controlled manner; and react the vaporized one or more constituent elements in a preliminary gas reaction (PGR) to modify the physical structure and properties of the vaporized one or more constituent elements to produce a composite material.

In this manner, the surface of the substrate is prepared for further processing steps, and a carbonaceous composite material has been produced. The process next proceeds in one of two directions (Steps B and H, described hereinbelow).

In a process Step B, the composite material is diffused into the surface of the substrate creating a "conversion zone" below the surface of the substrate. This is essentially a process of passive diffusion from a greater concentration in the PGR to a lesser concentration of composite material in the conversion zone. The process next proceeds in one of two directions (Steps C and D, described hereinbelow).

In a process Step C, the process can be stopped, at the point of having successfully formed a conversion zone with a concentration of composite material in the substrate. For example, the conversion zone may be diamond or DLC enhanced material composition whereby the physical volume of the original substrate may not be affected (altered, increased, or reduced).

Alternatively, (i.e., to the Step C), in a process Step D, the conversion zone can further be treated by repeating the steps of mobilizing, vaporizing and reacting (similar to the Step A) the composite material within the conversion zone, or mobilizing, vaporizing and reacting the one or more of the constituent elements from the substrate, or both. In the case of further treating the composite material within the conversion zone, the process acquires synergy and will proceed at a greatly increased rate (e.g. exponentially). This process is iterated to achieve any desired concentration of composite material at the surface of the substrate, and any desired gradient of composite material within the conversion zone.

At this point in the process, a diamond or DLC coating (fabricated material) can be fabricated on the surface of the substrate. The fabricated coating can be dissimilar from the composition of the conversion zone (e.g., the coating may be diamond). To fabricate the coating, a secondary source may (Step E) or may not (Step F) be introduced to the system.

In a process Step E, a "secondary" source (the substrate itself is considered the "primary" source) is activated to introduce one or more carbonaceous (carbon-containing) "secondary" elements (the one or more constituent elements of the substrate are considered to be "primary" elements) to the reaction system. The laser energy source is used, in this case, to fabricate a synthesized diamond or DLC coating on the surface of the substrate. The synthesized coating composition is, in this sense, a fabricated structure containing elements of both the secondary elements and the composite material.

Immediately below the surface of the substrate there will be a secondary conversion zone having a relatively small depth (as compared with the primary conversion zone) and a greater concentration of the one or more secondary elements than are present in the primary conversion zone. The secondary conversion zone, in conjunction with the primary conversion zone, provides an important function vis-a-vis bonding, support and stress distribution for subsequent fabrication of a coating on the substrate. The conversion zone (primary and secondary) has an overall influence in defining the parameters required for bonding, support and stress distribution for a subsequent coating, if any, fabricated on the substrate. In this manner, a conversion zone having a depth "d" can be formed below the surface of the substrate, and a coating material of thickness "t" can be fabricated on the surface of the substrate.

For example, to fabricate an approximately 3 mm thick layer (coating) of diamond (or DLC) on a steel or cemented carbide substrate, the primary conversion zone could be approximately 0.75 mm deep, and the secondary conversion zone could be approximately 0.25 mm thick.

Alternatively (i.e., to the Step E), in a process Step F, wherein a secondary source is not introduced to the system, a small amount of the composite material from the conversion zone is mobilized, vaporized and reacted (similar to the Step A) to form a secondary conversion zone below the substrate, which can further be reacted (by the energy source) to form a diamond or DLC coating on the substrate. This results in a coating being fabricated on the substrate which may be thinner than the coating which would have been fabricated using a secondary source (Step E).

It is, however, entirely possible that there will be a sufficient amount of carbonaceous constituent element available in the substrate itself to fabricate a relatively thick diamond or DLC coating on the surface of the substrate in the Step F.

For example, using a substrate of tungsten-carbide (e.g., 92%) in a cobalt matrix, the energy source will cause the tungsten and the carbide to disassociate into tungsten and carbon form, and the carbon can provide a "native" source for fabricating a diamond or DLC coating on the substrate. Additionally, dissolved carbon in the cobalt matrix also provides a "native" source of carbon for the fabrication of diamond or DLC coating.

This technique (process) is superior to prior art CVD (and PVD) processes in that in those processes cobalt will exhibit an undesirable graphite-forming influence in the system which will "poison" the system and inhibit the formation (fabrication) of a diamond or DLC coating.

Using the technique of the present invention, any graphite formed in the process will continuously be converted into the subsequent diamond coating. Preferably, all of the available graphite is consumed by the process. However, it is not destructive of the process if a small amount of graphite remains unconverted into diamond.

In a process Step G (which follows Step E in the process flow), as a coating is fabricated on the substrate, a different secondary source having different one or more secondary elements can be introduced to the reaction system. This is useful for fabricating a multi-layer coating on the substrate. For example, it may be desired to fabricate a first layer of DLC, covered by a second layer of diamond, and so forth. The first DLC layer may be fabricated with or without a secondary source, while the second diamond layer may be fabricated using a secondary source.

As represented by a process Step H, it may be desirable in some instances to avoid (or minimize) diffusing the composite material back into the substrate (see Step B), in which case the process can be stopped after mobilizing, vaporizing and reacting the one or more constituent elements of the substrate in the Step A. This is advantageous for fabricating a very thin diamond or DLC coating on the surface of the substrate.

For example, it may be desired to form a thin coating of diamond or DLC on the surface of a substrate (e.g., a copper wire), or below the surface of the substrate, without affecting the original volume of the substrate. For example, material compositions of selected areas or the entire area of ball or roller bearing tracks or races may be enhanced without affecting their physical volume (i.e., dimensions).

It is also possible that the process flow can proceed directly from the initial mobilizing, vaporizing and reacting (Step A) to the step (Step E) of introducing a secondary source to the reaction system. (This "bypass route" is considered a process step, and is shown as process Step I in the diagram of FIG. 1).

For example, in order to fabricate diamond or DLC on a substrate lacking in carbon (e.g., pure titanium), it may be necessary to introduce carbon as a secondary element to the system. The step of mobilizing, vaporizing and reacting the titanium from the substrate will serve to form a diffusion bonding with the subsequently fabricated diamond or DLC coating.

FIG. 2a shows a cross-section of an exemplary treated substrate 200 that has been treated according to the techniques of the present invention, according to one or more of the process steps described with respect to FIG. 1. Therein is shown a substrate 202 having a top surface 204, a secondary conversion zone 206 formed below the surface of the substrate, a primary conversion zone 208 formed underneath the secondary conversion zone 206, and a coating 210 that has been fabricated. The treated substrate 200 could result, for example, from performing the process Steps A, B, D and E (of FIG. 1).

FIG. 2b shows a cross-section of an exemplary treated substrate 220 that has been treated according to the techniques of the present invention, according to one or more of the process steps described with respect to FIG. 1. Therein is shown a substrate 222 having a top surface 224, a first coating layer 226 formed atop the substrate surface (the primary conversion zones and secondary conversion zones are omitted from this figure, for illustrative clarity), a second coating layer 228 formed atop the previous (as viewed) surface of the first coating layer 226, a third coating layer 230 formed on the top (as viewed) surface of the second coating layer 228, a fourth coating layer 232 formed on the top (as viewed) surface of the third coating layer 230, and a fifth coating layer 234 formed on the top (as viewed) surface of the fourth coating layer 232. Such a treated substrate 220 could result, for example, from performing the process Steps A, B, D, E and G (of FIG. 1). As mentioned above, each of the layers can have its own structure, such as crystal orientation, relative concentration of various carbon crystalline phases, etc. Generally, control over the structure of each fabricated layer in a multi-layer coating can readily be controlled by controlling the various parameters of the process (e.g., laser energy, secondary source, etc.). This demonstrates one aspect of the flexibility and controllability of the reaction system, namely, the nature and composition of a fabricated coating can easily be determined simply by the introduction of, in this case, a sequence of different secondary elements into the reaction system. As will become evident in the discussion that follows, there are many additional features of the technique of the present invention that allow a high degree of controllability and selectivity in the enhancement of material composition, including fabrication of coatings.

FIG. 3 illustrates, in a very generalized manner, a technique of the present invention. An energy source 302 directs a beam 304 of energy onto a selected area 306 on the surface 308 of a substrate 310. In order that an area greater than the selected area of the surface of the substrate can be treated, a mechanism for scanning the beam 304 across the surface 308, or vice-versa, or both, may be required. As will be evident, the energy source 302 is preferably three distinct lasers, each of which contributes in its own way to the overall reaction system.

Figure 3A:
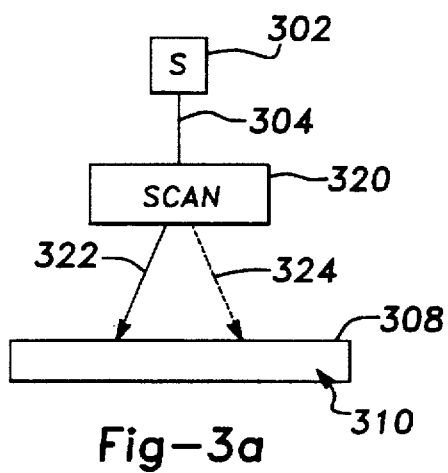
FIG. 3a is a schematic view of an implementation of the embodiment of FIG. 3.

FIG. 3a illustrates a suitable exemplary mechanism for scanning the beam 304 across the surface 308. In this example, the energy source (S) 302 is stationary, and the beam 304 is deflected by a scanning device (SCAN) 320 so that the selected area 306 is caused to scan across desired areas (which may include the entire area) of the surface 308 of the substrate 310. This is indicated by a beam exiting the scanner as a solid line 322 directed at one selected area on the surface of the substrate, and by the beam exiting the scanner as a dashed line 324 directed at another selected area on the surface of the substrate. In this manner, the beam can be "walked around" the surface of the substrate in any desired pattern. An exemplary scan pattern is indicated by the dashed line 326 in FIG. 3.

One of ordinary skill in the art to which the invention most nearly pertains will readily understand that such scanning of the beam can be effected under computer (e.g., CNC) control, and programmed to follow any desired path, dwelling on any portion of the area of the surface of the substrate for any desired time and that the energy level and focal points are parts of the process to be controlled.

Figure 3B:
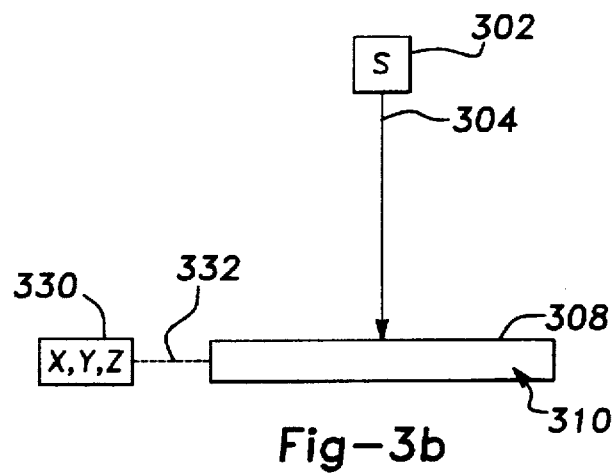
FIG. 3b is a schematic view of an alternative implementation of the embodiment of FIG. 3.

FIG. 3b illustrates a suitable exemplary mechanism for moving the substrate 310 relative to the beam 304, to effect analogous (to FIG. 3a) scanning of the beam across the surface 308 of the substrate 310. In this case, the substrate 310 is held in a positioning mechanism, such as in the end effector (e.g., x,y,z) 330 of a multi-axis robot. This is indicated by a dashed line 332 extending between the end effector 330 and the substrate 310. In this example, it is possible to move the substrate in any of the x, y and z directions, which is useful for treating a multi-surfaced substrate (compare FIG. 2) and/or for controlling the distance between a selected area of the substrate surface and the energy source 302. For a flat substrate, having a substantially planar surface, it may be acceptable to move the substrate with a simpler mechanism, such as with an x-y positioning table. However, it may be necessary for specific applications desirable to control additional configurations, including controlling the focal points and angles of incident beam 304.

For certain applications it may be desirable to have both a scanning device 320 (FIG. 3a) and a multi-axis positioning mechanism 330 (FIG. 3b) to achieve a desired "profile" of conversion zone (CZ) and fabricated coating.

One of ordinary skill in the art to which the invention most nearly pertains will readily understand that such movement of the substrate can be effected under computer control, and programmed so that the beam will follow any desired path, dwelling on any portion of the area of the surface of the substrate for any desired time.

The energy source 302 can be focussed, diffused, converged, diverged, transported, or the like by interposing suitable known optical elements for achieving these functions in the path of the beam and which may be controlled by a computer numerical control. The parameters of the energy source can be effectively controlled to achieve the desired treatment.

Figure 4:
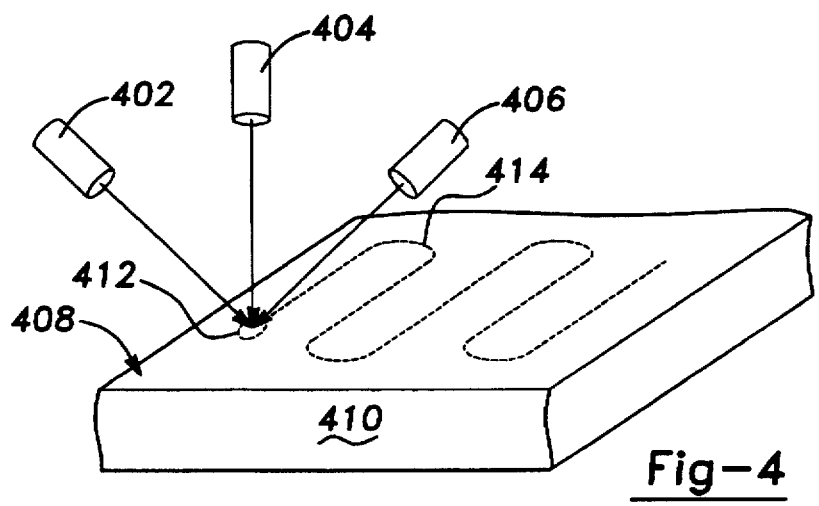
FIG. 4 is a perspective view of an embodiment of the present invention, showing three energy sources (e.g., lasers) treating a surface of a substrate.

FIG. 4 shows a preferred embodiment of the invention wherein three lasers 402, 404 and 406 function as the energy source (302) for treating the surface 408 of a substrate 410. The three lasers each output a beam onto a selected area 412 of the surface 408 of a substrate 410. As was illustrated with respect to FIG. 3, the beams can be scanned, or the substrate can be moved, so that the selected area is scanned in a path 414 (compare 326) across the surface 408 of the substrate 410. Generally:

a first laser 402 is used to vaporize the constituent element (create the gas phase). The first laser 302 is preferably an excimer laser operating, for example, at 192, 248 or 308 nm (nanometers). Such excimer lasers are useful for vaporizing any of a number of elements. Usually, the excimer laser will take the lead role in causing the constituent element to vaporize, and in initiating a preliminary vapor reaction (PVP) above the surface of the substrate, but, as will be evident, in some instances the second laser 404 may assume the lead role in vaporizing the constituent element from the substrate and initiating the gas reaction in the PVP.

a second laser 404 is used to balance the thermal gas reaction and the stoichiometric chemistry of the gas phase reactions occurring in the PVP. This laser 404 is preferably a Nd/YAG laser, and normally assumes a supportive role (in a manner of speaking) to the lead role of the excimer laser. In some instances (scenarios), the Nd/YAG laser will also aid in vaporizing the constituent component, especially in the context of bright materials, and in some instances the Nd/YAG laser will assume the lead role and be supported by the excimer laser (the roles of the two lasers are interchanged). Generally, by using both an excimer and a Nd/YAG laser, to initiate vaporization of the constituent element (into the PVP) and to balance the reaction (PGR), there is an interaction between the two that keeps the reaction mechanism balanced out. It is advantageous, in any instance, to use both of the lasers to support the reaction. For example, if it is desired to form a diamond coating, the greater power and temperature capabilities of an excimer laser will take the lead in initiating the gas phase reaction, and will be supported by the Nd/YAG laser.

a third laser 406, preferably a $CO_2$ laser, is used to balance the thermal, physical, gas and chemistry reactions occurring above the surface of the substrate. The principal role of the $CO_2$ laser is to provide thermal balance, and to avoid there being a substantial thermal gradient in the reacted gases. The $CO_2$ laser will also provide a minimum temperature balance for the gas reaction, and will bias the temperature of the reaction. In certain instances (i.e., with certain substrate materials), the $CO_2$ laser could also be employed to initiate the reaction (take over the primary role of the excimer laser).

Further discussion of the roles of each of the three lasers in the reaction system is set forth hereinbelow.

Although the lasers are shown in FIG. 4 as directing their respective beams onto the reaction zone of the substrate from different angles, it is within the scope of the present invention that the beams could be directed coaxially at the reaction zone.

Figure 5:
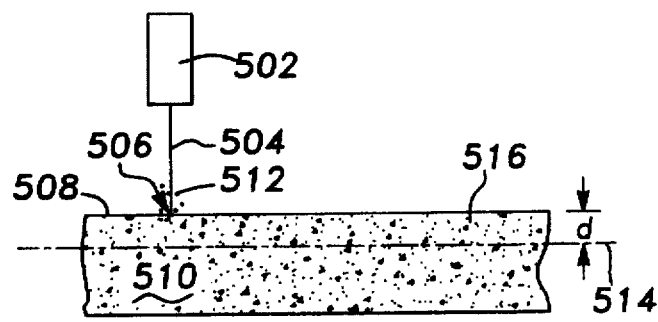
FIG. 5 is a schematic view of the embodiment of FIG. 4, showing a substrate, in cross-section, at an early stage of treatment.

FIG. 5 illustrates the formation of a conversion zone (CZ) being formed below the surface of the substrate as a result of the energy directed at the surface of the substrate, employing the techniques of FIG. 4. An energy source 502 (compare 402, 404 and 406) directs a beam 504 of energy onto a selected area 506 (compare 306) of the surface 508 (compare 408) of a substrate 506 (compare 410). (A single energy source is shown in FIG. 5 for illustrative clarity.) For purposes of this discussion, the surface 508 of the substrate 510 is termed a Preliminary Reaction Surface (PRS). Again, the energy source (502) is preferably three distinct lasers. However, a one of the lasers may assume a dominant (e.g., exclusive) role in forming the conversion zone (CZ).

The beam 504 causes relatively intense localized heating within the substrate 510, under the PRS 508, sufficient to mobilize constituent elements (shown as dots within the substrate) from within the substrate towards the PRS where they will be evaporated (vaporized) by the beam 504. The evaporated constituent element is shown as dots 512 above the PRS (outside the surface of the substrate) existing in a preliminary vapor phase (PVP).

The beam 504 causes a gas reaction in the PVP, causing physical changes to the makeup of the vaporized constituent elements 512. (This function may be dominated by another one of the three lasers.) For example, graphite vaporized out of the substrate can be physically converted to diamond (or DLC) by the beam 504. Further, the beam 504 will cause some of the converted, vaporized constituent element to be diffused back into the substrate. This is indicated by a dashed line 514 delineating a conversion zone (CZ) 516 extending into the substrate at a distance "d" below the PRZ. Subsurface region "d" subsumes the primary conversion zone "d1" and the secondary conversion zone "d2".

Figure 5A:
FIG. 5a is a schematic view of the embodiment of FIG. 4, showing the substrate, in cross-section, at a later stage of treatment.

FIG. 5a illustrates the completion of the formation of a composite material in the conversion zone 516, resulting from the beam having been scanned across the entire surface of the substrate 510. The presence of a composite (converted) material is indicated by the cross-hatch lines extending through the conversion zone (CZ). Evidently, there remains a lower concentration of constituent element (dots) in the conversion zone than there was prior to the treatment of the substrate. In this sense, the substrate has been degraded (less constituent element; substrate rarified) in the conversion zone. Further, it will be appreciated that the concentration of constituent element will be least at the surface 508, and greatest at the bottom (as viewed) of the conversion zone 516. Conversely, the concentration of composite material will be greatest at the surface of the substrate, and will decrease to zero towards the bottom of the conversion zone. The gradient of composite material is beneficial in equalizing (balancing) stresses applied to the surface of the treated substrate and, as will be seen, in providing a firm foundation for a coating formed on the surface of the substrate.

Figures 6, 6A:
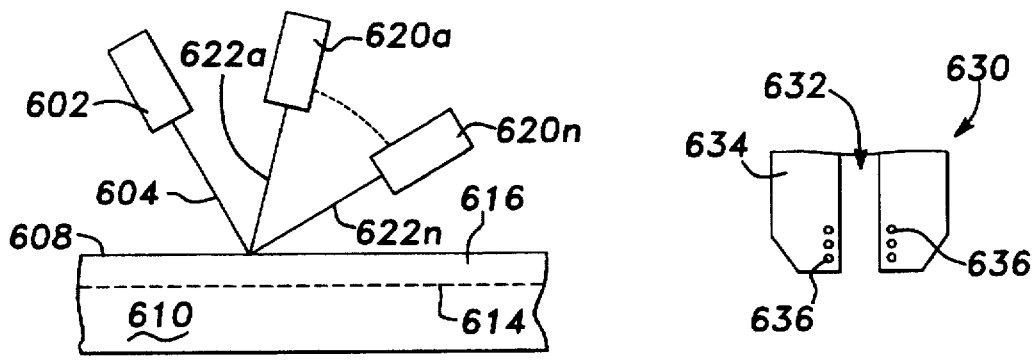

FIG. 6 shows the treatment of a substrate, similar to what was shown in FIG. 5, with the feature that a secondary element can be added to the overall process. As in FIG. 5, a single energy source 602 (compare 502) is shown, which preferably includes three lasers (compare FIG. 4), directing a beam 604 (compare 504) onto a surface 608 (compare 508) of a substrate 610 (compare 510). In the manner previously discussed with respect to FIG. 5, a conversion zone 616 (compare 516) of composite material will be formed within the substrate.

In the embodiment of FIG. 6, there is also provided at least one secondary source 620 (620a . . . 620,) providing a secondary element 622 (622a . . . 620n) as a gas, a vapor, a powder, or other suitable form, to augment the gas reaction occurring in the reaction zone immediately above the surface of the substrate. The subscript "n" designates the number of secondary sources and elements. The secondary element 622 is suitably provided by a nozzle (jet) adequate to direct a stream of the secondary element at the reaction zone, so that the secondary element can contribute to the reaction that is being caused by the energy source 602. It is preferred that the secondary element be directed at the reaction zone whereat the energy source 602 is treating the substrate, but is also possible to introduce the secondary source at another selected area on the substrate, or to simply "flood" the substrate with the secondary element.

In this manner, a coating may be fabricated on the surface of the substrate, for example, as described with respect to Step E in the process flow diagram of FIG. 1.

The secondary element is introduced into the reaction system by any of a number of known means, such as by spraying, dispersing, depositing, ablating, or any other known means, and may be in the any suitable form such as a liquid, a gas, a solid, a plasma, a powder, or the like.

For example, a gaseous secondary element may be introduced into the reaction system using a pressurized nozzle (jet) that is designed to deliver the gaseous secondary element in an envelope of another (e.g., inert) gas which will focus (direct) the delivery of the secondary element by helically-controlled swirling of the gases exiting the nozzle (jet). In this manner, the secondary element can be directed to the same selected area of the substrate as the incident energy beam. According to a feature of the invention, the gaseous secondary element and the enveloping gas can both serve as secondary elements in the reaction.

The secondary element may also be selected to serve as a "shield" (from the environment, without necessitating the use of a vacuum) for the process when a secondary source is not needed (see, e.g., Step C, F and H in the process flow, described hereinabove), in which case the secondary element (and the enveloping gas) may be a clean or inert gas. Depending on the treatment, a shielding function may not be necessary.

FIG. 6a illustrates, generally, a spray nozzle (jet) 630 suitable for introducing a controlled stream of secondary element (which may be an inert element) into the reaction system, and for directing the stream at the same reaction zone that is being treated by the energy source. The nozzle (jet) 630 is provided with an orifice 632 extending axially through the nozzle (jet) body 634. In this manner, for example, a stream of gaseous secondary element flowing through the orifice 632 can be directed at the reaction zone. However, it is likely that the stream will tend to disperse once it exits the orifice. In order to keep the stream more tightly focused, and/or to envelop the stream in a protective environment, additional orifices 636 (three pairs of additional orifices shown) are provided in the nozzle (jet) body to create a helical flow of an additional gas, such as an inert gas. One skilled in the art to which the present invention most nearly pertains will readily understand how to adapt such a nozzle (jet), or similar device, to the intended purpose based on an understanding of fluid dynamics. Additional embodiments of secondary sources are discussed hereinbelow.

Figure 6B:
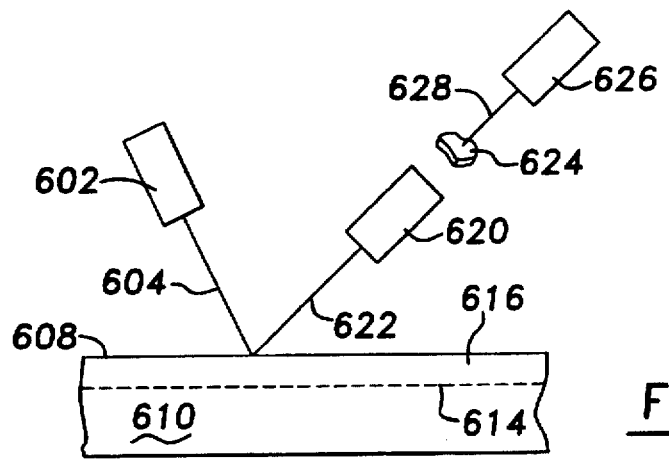
FIG. 6b is a partial cross-sectional view of an alternate apparatus suitable for introducing secondary element into the reaction system.

FIG. 6b shows an alternate embodiment of the present invention. According to this embodiment, a target 624, such as graphite, may be contained outside or within the nozzle (jet) 620 and irradiated by an energy source 626 having energy beam 628. Energy source 626 may be introduced from energy source 602 by utilizing necessary optics and configuring sufficient parameters.

Having thus established how the reaction process can be implemented, varied and controlled, it is evident that the technique of the present invention can be used to create a wide variety of diamond and DLC coating compositions and geometries (shapes, profile, etc.) on a substrate.

Figure 7A:
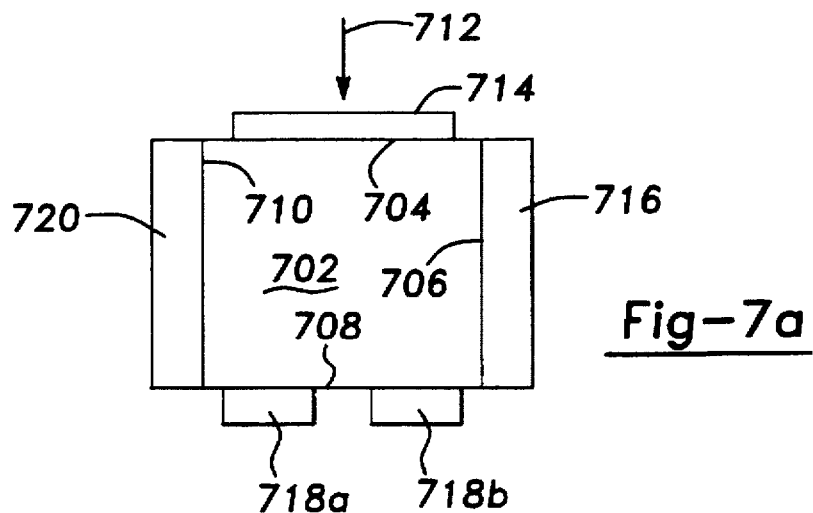
FIG. 7a is a schematic view of an embodiment of the invention illustrating each surface of an object have a different composite material.

FIG. 7a illustrates a substrate 702 having four surfaces 704, 706, 708 and 710 being treated by a beam 712. (A secondary source is omitted from this figure, for illustrative clarity.) A coating 714 is fabricated on the surface 704, a coating 716 is fabricated on the surface 706, a coating having two segments (718a and 718b) is fabricated on the surface 708, and a coating 720 is fabricated on the surface 710.

Assuming that the beam is always incident from the top (as viewed), and is fixed (compare FIG. 3b), it is evident that the substrate will need to be moved (e.g., scanned in the x-y plane) in order for the beam to treat a substantial area of the surface 704. As shown, the coating 714 covers less than the entire area of the surface 704, and more area than one reaction zone. It is also evident that the substrate will need to be rotated in order to treat the side surfaces 706 and 710 which are parallel to the beam 712, and the opposite surface 708 which is entirely blocked from the beam. By rotating these surfaces into position, they may be treated with the same ease as treating the surface 704. As illustrated in the figure, each of the coatings (and segments) may be of a different thickness and extent (area coverage) than the other of the coatings. Each coating (and segment) may also be of different composition than the other coatings, depending on the selection of secondary element introduced to the reaction system during the formation of the coating. Primary conversion zones and secondary conversion zones (not shown, for illustrative clarity) below the surface of the substrate may also differ from surface-to-surface, depending on the process parameters invoked during the treatment of the particular surface of the substrate.

Figure 7B:
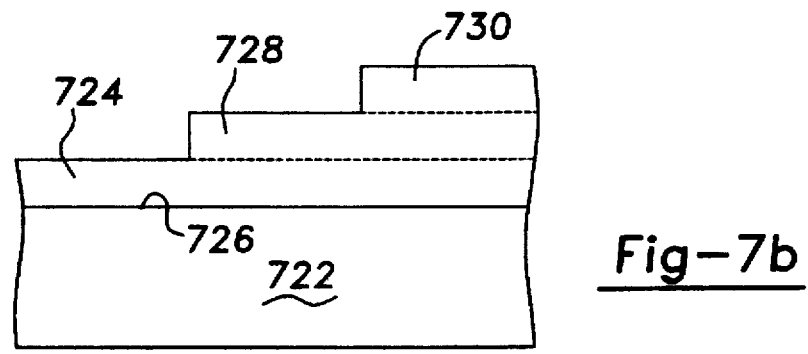
FIG. 7b is a schematic view of an embodiment of the invention illustrating a feature of the invention that different thickness regions of a coating and/or different coating layers each having a different area of coverage can be fabricated on a surface of a substrate.

FIG. 7b illustrates a feature of the invention that different thickness regions of a coating and/or different coating layers each having a different area coverage can be fabricated on the surface of a substrate 722. (primary and secondary conversion zones are omitted, for illustrative clarity.) In this example, a first coating 724 is fabricated on a surface 726. A second coating 728 is fabricated over the first coating 724, and is of lesser extent (area coverage) than the first coating 724. A third coating 730 is fabricated over the second coating 728, and is of lesser extent (area coverage) than the second coating 728. The coatings 724, 728 and 730 can be of similar or dissimilar composition, and of similar or dissimilar thickness than the other of the coatings.

According to a feature of the invention, the energy driving the reaction system may be directed at selected areas of the substrate, and can be scanned in any pattern on the surface of the substrate, to fabricate any desired "profile" (e.g., compositions, thickness, shape) or pattern of coatings on the substrate.

Figure 7C:
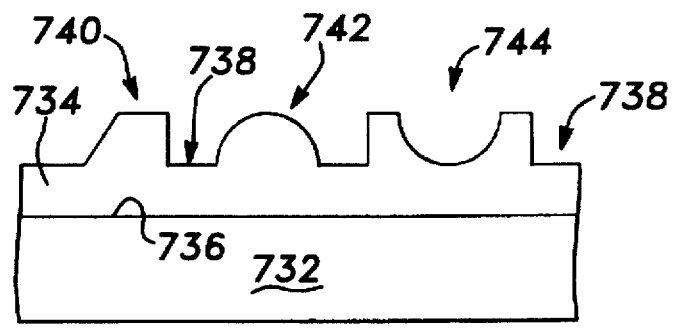
FIG. 7c is a schematic view of an embodiment of the invention illustrating a few of the complex coating shapes that can be fabricated using the techniques of the present invention.

FIG. 7c shows a substrate 732 having a "tailored" coating 734 fabricated on its surface 736. (Primary conversion zones and secondary conversion zones are omitted, for illustrative clarity.) Portions 738 of the coating are flat. Other portions 740, 742, 744 are of limited extent (area coverage), and are fabricated to be thicker than the portions 724 so that they extend above (higher than) the portions 734. Further, the portions 740, 742, 744 can be formed to be tapered (740), to have a flat top surface (740, 744), to have steep sidewalls (740, 744), to be rounded (742, 744), to have a convex top surface (742) or to have a concave top surface (744). The composition of each portion shown in FIG. 7c is readily controlled, according to the techniques of the present invention.

This illustrates only a few of the complex coating shapes that can be fabricated using the techniques of the present invention.

FIG. 7d illustrates an additional "menagerie" of shapes that can be fabricated as coating structures on the surface of a substrate, including cylinders 752, tubular structures 754, conical structures 756, "L"-shaped structures 758, curved structures 760, and tower-type structures 762. The tower-type structure 762 is demonstrative of a particularly remarkable feature of the present invention, namely its true heteroepitaxial (omnidirectional) capabilities. In order to form such a coating structure, the base portion 762a of the structure is first fabricated to extend away from the surface of the substrate, then the substrate (or the energy source/ secondary source) is re-oriented, and growth of the structure is continued in another (orthogonal, as shown) direction. Another remarkable feature of the present invention is that all of the structures shown in this figure can be fabricated on the same surface of the same substrate, and each structure can have a composition differing from the other structures. By way of analogy, the substrate can be viewed as a countertop, upon which any number of useful objects can be placed. (Of course, these objects will be diffusion bonded to the countertop using the techniques of the present invention.)

FIG. 7e illustrates another remarkable, and useful, feature of the present invention. In this case, a snake-like coating 766 is formed on a surface of a substrate 768 (compare 760, FIG. 7d). In this case, it is desired to form different coating compositions in different segments of the snake. For example, a first segment 766a can be fabricated to have a first composition, a second segment 766b can be fabricated to have a second composition, a third segment 766c can be fabricated to have a third composition, and a fourth segment 766d can be fabricated to have a fourth composition. The remaining segments can be fabricated to repeat the sequence (first, second, third, fourth compositions). Alternatively, the segments can represent a code, analogous to storing information (binary, trinary, quadrary, etc) in the snake. These techniques are, for example, analogous to forming a diamond (e.g.) chromosome. The resolution (size) of the segments is limited only by the wavelength of the lasers employed to form the segments, and segments having lateral dimensions on the order of 308 nm are readily formed. A "snake" of alternating segments of diamond and DLC can readily be formed.

FIG. 7f illustrates how a number (nine shown) of coating segments (772a . . . 772i) can be formed in an array on a surface of a substrate 770. Each of the segments of the array can be formed of a different composition, and each of the segments can be formed of a different thickness. The segment 772b is shown having a greater thickness than the remaining segments (772a, 772c . . . 772i). Any, or all, or the segments can also be fabricated as a multi-layer structure (compare FIG. 2b).

FIGS. 7a–7f illustrate the capability of the techniques of the present invention for fabricating "designer" coatings and compositions. This is important, since the prior art is generally limited to forming a single coating "type" on a surface of a substrate, and demonstrates the degree of control inherent in the process of the present invention.

Figure 7G:
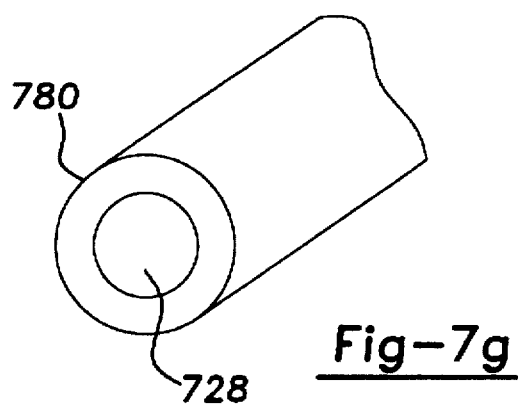
FIG. 7g is a schematic view of an embodiment of the invention illustrating a cylindrical coating of fabricated on a cylindrical object.
Figure 7H:
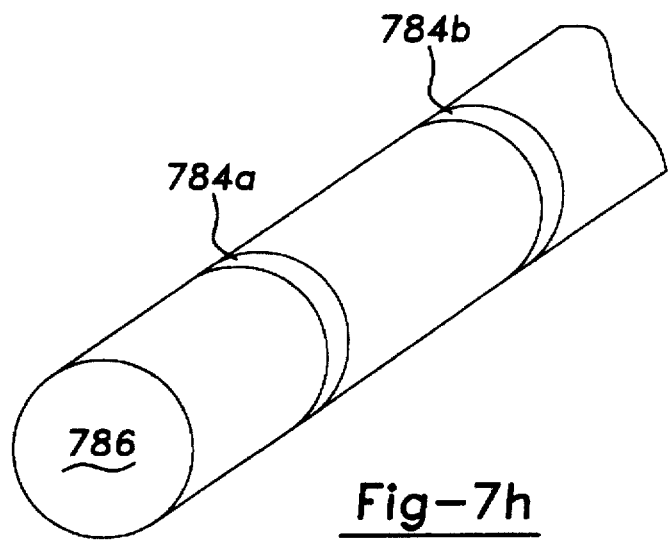
FIG. 7h is a schematic view of an embodiment of the invention illustrating bands of coatings applied at different longitudinal positions along a cylindrical object.

FIGS. 7g and 7h illustrate techniques for treating cylindrical objects, as exemplary of the ability of the present invention to coat surfaces that are not flat.

In FIG. 7g, a cylindrical coating 780 is fabricated on a cylindrical substrate 782. The cylindrical substrate may be of any length. This illustrates the continuous nature of the technique of the present invention. For example, the cylindrical substrate may be a wire (e.g., copper) of extraordinary length (thousands of feet). By passing the wire through a workstation, the coating reaction can be performed continuously along the length of the wire.

In FIG. 7h, it is illustrated how bands 784a and 784b of coatings can be applied at different longitudinal positions along a cylindrical substrate, such as a wire. These bands, of course, could be segments, and may have properties to differentiate one segment from the other (compare the snake 766 of FIG. 7e).

Although it has primarily been discussed, in FIGS. 7a–7h, how coatings can be fabricated on a substrate, it is within the scope of this invention that any or all of the process steps (see FIG. 1) could be performed in the controllable manners illustrated by these figures which, for example, may simply involve treating the subsurface of the substrate.

It has been emphasized, hereinabove, that the techniques of the present invention are superior, from a process viewpoint, to CVD processes and the like, since no preheating or vacuum environment is required. (It has also been emphasized that the techniques of the present invention are superior since they result in diffusion bonding rather than relying on molecular bonding.) As will be evident from discussion hereinbelow, the techniques of the present invention are also superior to known processes employing lasers.

It is within the scope of this invention that the techniques of the present invention can also be carried out as an "adjunct" to CVD-like processes.

According to the present invention, one or more of the process steps, and techniques of the present invention, can be carried out in a vacuum environment, and can include many of the same steps that are involved in a CVD (or PVD) process. For example, rather than heating the entire substrate to drive a deposition reaction, the energy can be brought to bear upon (directed at) selected areas of the substrate, and can be scanned in any pattern on the surface of the substrate, to fabricate any desired "profile" (e.g., composition, thickness, shape) or pattern of coatings on the substrate. This will avoid all of the problems associated with heating the entire substrate, and will provide for results that are not otherwise obtainable with CVD or PVD processes (without masking the substrate).

For example, in conjunction with a CVD-like process, the energy source (e.g., excimer) could be used to finish, trim, polish and/or modify the treatment of the substrate.

Figure 8:
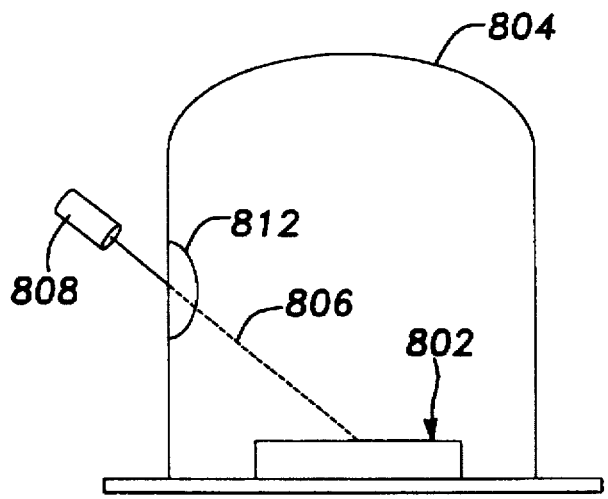
FIG. 8 is a schematic view illustrating how the process of the present invention serves as an adjunct to a CVD-like process.

FIG. 8 is exemplary of how the processes of the present invention serve as an adjunct to a CVD-like process. A substrate 802 is disposed in a vacuum environment (illustrated as a bell jar) 804. Rather than pre-heating the entire substrate, an energy beam 806 from an energy source 808 (compare 302, FIG. 3) is directed at the substrate. The energy source 808 can be located outside of the vacuum environment. To this end, it is illustrated that the energy beam 806 would enter the vacuum environment (i.e., enter the belljar) through a suitable window 812. The remaining components necessary for utilizing the invention as an adjunct to a CVD-like process are not necessary to show in FIG. 8, as CVD processes, and the like, are well known.

As mentioned hereinabove, the techniques of the present invention are useful for coating the inner diameters (ID) of tubular substrates, and are especially useful for coating the ID of tubes having a large ratio of length (L) to diameter (D) (greater than 3:1).

FIG. 9a illustrates one technique for coating the ID of a tubular substrate 902. An energy beam 904 (compare 304, FIG. 3) is directed into one (open) end 906 of the tubular substrate 902. The other end 908 of the tubular substrate is closed off, preferably by concave (or may be convex, not shown) parabolic reflecting surface 910 (shown spaced apart from the end 908, for illustrative clarity). In this manner, the beam 904 will bounce around inside of the tubular substrate, and treat the entire ID of the tubular substrate. A secondary element may or may not be introduced into the system, as desired.

FIG. 9b illustrates another technique for coating the ID of a tubular substrate 912. An energy beam 914 (compare 304, FIG. 3) is directed into one (open) end 916 of the tubular substrate 902. The other end 918 of the tubular substrate may also be left open. A secondary element may also be introduced, as indicated by the stream 920 (e.g., of gaseous secondary element).

For tubular substrates having exceptional depth (e.g., high L:D), it is possible to dispose a simple (e.g., flat) reflecting mirror within the ID of the tubular substrate to direct the incident energy beam to selected areas on the ID of the tubular substrate. In this manner, selected areas (axial, circumferential, helical) of the ID can be treated by the beam. Further, by sequencing the introduction of a secondary source, the treatment can be varied from selected area to selected area, in a manner similar to that of FIGS. 7e, 7f and 7h).

The present invention is useful for coating any of a number of substrates, several of which have been discussed hereinabove. For example, the inner or outer diameters of a helical travelling wave tube could be treated and/or coated, as well as to produce windows for traveling wave tubes. Resistive heating elements could be treated and/or coated, for example, to aid in heat distribution, as well as the inner and/or outer surfaces of cookware. Coatings can be fabricated on replacement hip joints, and the like, so that a portion of the object being coated is provided with a low-friction coating (with, if required, enhanced high load-carrying capacity), while another portion of the object is provided with a porous or textured coating (e.g., to promote bonding to a bone surface). Gun barrels, cylinder liners, and the like, can advantageously be treated by the techniques of the present invention. Razors, knives and scalpels can easily have their cutting edges treated by the techniques of the present invention. Cutting tools, such as drill bits, can be improved by fabricating stepped flutes, by fabricating a diamond coating on the flank of the tool, and by fabricating chip-breaker geometry into the tool, which would otherwise be difficult to achieve using grinding apparatus. Diamond, for example, is soluble with iron, in which case it may be desired to form a silicon nitride coating on the tool (or other substrate). The present invention is capable of extracting and forming a composite material with virtually any constituent (primary) element from a substrate and secondary element, including silicon, copper, oxygen, nitrogen, boron, and the like. The application of the techniques of the present invention to dry machining are virtually unlimited.

FIG. 10 shows a component 1002 of a ball bearing, which has had the surface of its race treated to have a hard (e.g., diamond or DLC) coating 1004. This, for example, will allow for the bearing to function without (or with less) lubrication, in much the same manner as treating machine tools according to the present invention facilitates dry-machining.

FIG. 10a shows a component 1002 of a ball bearing, which has had the entire surface of the component 1002 treated to have hard (e.g., diamond or DLC) coating 1006. In this manner, the coating 1006 will function as a heat sink, so as to remove heat from the ball and race, and for protecting against corrosion. (The race is shown having a coating 1004; compare FIG. 10.)

The techniques of the present invention are advantageous for fabricating a number of coatings for any number of purposes, for example corrosion-resistant and erosion-resistant coatings, and coatings that are inert with respect to a hostile operating environment (e.g., steam boilers and the like). An advantage of the present invention is that entire surfaces of a substrate can be treated without heating the entire substrate. Prior art techniques which involve such "gross" heating of the substrate can cause, for example, an underlying steel substrate to lose its temper (hardness) when a diamond coating is applied (e.g., by a CVD process, or the like). Refractory coatings can be fabricated on large surface areas, because the technique of the present invention can be performed in a continuous manner, in an ambient environment.

Hard coatings over an underlying softer substrate will adhere better (e.g., due to the diffusion bonding), and the coated structure will accommodate stress in a superior manner because of the gradient evident in the transition and conversion layers. Further, multi-layer coatings can be formed to aid in stress and shock distribution.

The processes of the prior art (e.g., CVD or PVD) are not robust, and cannot be performed continuously. For example, the need for a vacuum environment imposes a severe constraint upon the size of the substrate which can be coated, and it is also typically required that the substrate be pre-heated and post-cooled. The resulting coating, for example the Langmuir-Blodgett molecular layer coating disclosed in U.S. Pat. No. 5,273,788, tends to be very thin and, inasmuch as it is desired that the coating be harder (e.g., diamond or DLC) than the substrate (carbide steel), there is a very abrupt stress transition at the interface of the coating and the substrate. Further, the adhesion of the coating to the substrate tends to be limited to molecular bonding. Further, in CVD or PVD type processes, the elements being deposited onto the substrate will continue to rain down upon the surface of the coating, which may necessitate post-process finishing (typically abrasive) steps to achieve a smooth finish on the top surface of the coating. Further, the prior art processes all tend to be limited to coating a single surface of a substrate having a relatively simple geometry (e.g., a planar substrate), the coating having a relatively uniform thickness across the surface of the substrate.

Generally, the present invention differs from the processes of the prior art in that:

the substrate itself is used as a primary supply of coating constituent elements (source);

no vacuum chamber is required; and no overall substrate pre-heating is required.

Further, the present invention differs from the processes of the prior art in that a composite material is formed below the surface of the substrate.

Further, the present invention differs from the processes of the prior art in that a substrate of complex geometry can be treated, and the depth of the composite material can be controlled (i.e., can be profiled to be non-uniform).

Further, the present invention differs from the processes of the prior art in the formation of composite materials within a secondary conversion zone and a primary conversion zone, within the substrate itself, which effect diffusion bonding of a subsequent coating and which allow for stress to be distributed.

An important aspect of the invention is that the process can proceed without introducing any secondary element at all, solely on the basis of the constituent element which is "native" to the substrate. It is optional that a secondary element be introduced. In CVD processes, and the like, it is required that a secondary element in the form of a nucleation (seed) material first be formed on the surface of the substrate.

According to the invention, if there is an insufficient concentration of the constituent element in the substrate, or if it is desired to have an additional constituent element, a secondary element can be added in the form of a gas, powder or the like. The secondary element can be the same as, or different from the constituent element. Generally, for forming diamond and DLC coatings, the constituent and secondary elements will both be carbon-containing elements.

The treatment of the present invention, reaction can be continued so as to cause a coating to be fabricated on the surface of the substrate, and the resulting coating can be extraordinarily thick, and of practically any chosen texture (without requiring post-processing). For example, an excimer laser (one of the three lasers) is suitably employed for providing any desired surface finish on the fabricated coating.

In contrast to prior art methods, wherein the high cobalt content of a substrate will form graphite, which will "poison" diamond formation, in the present invention any such graphite can be advantageously employed as a source of constituent carbon for forming a diamond coating on the substrate.

The process can be performed in an ambient (non-vacuum) environment, and does not require overall heating the substrate. Vacuums and heating apparatus are typical of CVD and PVD processes.

The present inventive technique is somewhat analogous to a thick layer of ice forming on a pond, in which case there is a thick, robust layer (CZ) of hard material formed in the pond (substrate) itself. This provides a solid foundation for a subsequent thin layer of ice which may form from freezing rain (secondary element) falling onto the frozen pond (substrate).

Viewed from another perspective of constituent native species in the substrate being mobilized and evaporated out of the substrate, the present inventive technique is somewhat analogous to the sun beating down on a pond, forming a thermocline (composite) layer immediately under (and including) the surface of the pond. Water vapor will also evaporate out of the pond.

Advantageously, when an ultraviolet laser is employed, it is possible to achieve virtually any texture on the resulting coating as may be desired, from rough (textured, e.g., to hold lubricants) to optically smooth, without post-processing. The ultraviolet laser has the ability to ablate the final surface to take out roughness and/or contaminants.

Generally, the three lasers operate simultaneously, and are directed, using any suitable optics, to the same area on the substrate. Optics may be interposed between the lasers and the surface of the substrate so that the beams emitted by the lasers are either focused or diffused or otherwise altered.

For a substrate larger (in area) than the spot size of the laser beams, it is evidently necessary to impart some relative motion between the lasers and the substrate or optically diverge the beam.

For a large, relatively flat substrate, relative motion between the lasers and the substrate can be imparted relatively easily with mirrors, or other suitable beam directing devices, scanning the beams across the surface of the substrate.

For more complex shaped substrates, especially those wherein it is sought to treat more than one simple surface (such as a drill bit), the workpiece can be moved relative to the lasers. Virtually any industrial robot is suitable to sequentially present areas of the substrate to the beams for treatment.

The techniques of the present invention are suitable for fabricating a coating exhibiting virtually any lattice structure, depending only on the secondary elements introduced into the reaction system and upon the constituent elements extracted from the substrate.

By employing the techniques of the present invention (compare the list of prior art limitations set forth hereinabove):

(a) A higher deposition rate is achieved, such as on the order of one or more millimeters per hour.

(b) Greater adhesion (e.g., 50 kg/mm$^2$) is provided for cutting tools.

(c) Crystalline coatings can be fabricated, such as with a crystal lattice structure, and with an SP$^2$- or SP$^3$-bonded carbon structure, and with a controlled mix, if desired.

(d) There is no pre-heating or cool-down time required.

(e) The process does not require a vacuum environment. Hence, there is no theoretical limit on the size of the substrate. Further, mechanisms for manipulating the substrate are more readily accommodated in an ambient (versus vacuum) environment.

(f) The parts can be manipulated, various layer thicknesses can be achieved, and the coating can be applied to specific areas of the part without masking.

(g) The coating (e.g., diamond) will adhere well to substrates having more than 10% cobalt content, thereby substantially eliminating the need for specialty substrates.

(h) Stainless steel can easily be coated using the techniques of the present invention.

(i) Steel can easily be coated using the techniques of the present invention, thereby eliminating requirements (in the first instance) for stainless.

(j) The inventive technique works well for coating the inside diameters (ID, bore) of tubes, including those having a relatively high length:diameter (L-to-D) ratio.

(k) Sculpting and texturing may be accomplished during the coating process, thereby eliminating post-finishing steps of the prior art.

(l) The technique of the present invention is heteroepitaxial.

(m) The technique of the present invention effectively coats all sides evenly, or selectively, for any shape substrate.

(n) There is no Raman variance evident when employing the technique of the present invention, with substrates having various compositions, to obtain a desired composite materials. For example, Raman spectral analysis reveals that substrates of various compositions have little or no effect on diamond or DLC coatings produced by techniques of the present invention.

(o) Substrates having complex geometries can be treated, and various dopants (e.g., boron) can be introduced into the surface treatment.

As mentioned hereinabove, an advantage of the techniques of the present invention is that there is no post-process finishing required to obtain a desired surface texture. The ultraviolet laser itself (for example) can be used to ablate the surface to obtain virtually any texture ranging from rough to optically-smooth.

In the prior art deposition techniques, post-finishing steps would be required to obtain a texture smoother than the texture achieved by deposition. For example, an abrasive would be used to polish the coated surface of the substrate. The use of an abrasive, however fine, will leave traces (evidence) of the substrate having been polished in the form of scratches. A subsequent ultraviolet laser, ion beam, smoothing or polishing process can also be required.

By circumventing the use of abrasives, and the like, in post-process finishing steps, the resulting substrate (product-by-process) will not exhibit such scratches and will have a non-directional surface finish.

The present invention simplifies and improves the process of either modifying a substrate or forming a coating on a substrate, and has numerous applications, including, but not limited to:

component and materials manufacturing;

next generation tool shop with material manufacturing;

draw die tooling;

aluminum and other extrusion tooling;

beverage can making punches;

can seaming components; and automotive valve seat material enhancement in parent material.

A number of exemplary applications are described hereinbelow.

Automotive Cylinder Head Valve Seats

The inventive method of material enhancement set forth above is also useful for imparting enhanced properties within the parent material of automotive cylinder head valve seats.

The typical process includes rough and finish milling of the cylinder head valve seats to accept a pressed-in clad insert (e.g., stellite) which must be subsequently finish machined in-situ.

The method contemplated by this invention circumvents the requirement for an insert by enhancing the parent material of a cylinder head with sufficient hardness in the surface and subsurface to withstand the impact of the valve without yielding over the useful life of the engine. The enhanced substrate of the previously machined valve seat has conversion zones within the parent aluminum of advanced composite metal/ceramic enhanced material.

Draw Tooling

The invention finds further use in the materials enhancement of draw tooling (such as used for the production of wire and tubing) and extrusion tooling (especially aluminum extrusion, since diamond for instance, has negligible affinity for aluminum).

It has been demonstrated that extrusion tooling, using the enhanced material synthesis described, provides substantially increased extrusion tonnage (versus untreated carbide and steel extrusion dies) as well as vastly improved die life and dry extrusion capability (less pollution; energy conservation).

Can Punches

Another embodiment of the material enhancement is in beverage can punches used for the production of aluminum beverage and other cans. Carbide punches can be replaced with lighter steel punches with enhanced surface treatments. This allows the high speed can making machinery to run at even higher speeds because of the reduction in weight of the punches. In addition, surface texturing of the enhanced layer results in reduced forming loads. Furthermore, the resulting increased lubricity of the textured punch surface enhancement can reduce the number of forming operations to produce a given feature. The tailored composition of the enhanced surface may totally eliminate requirements for lubricating the punches or forming tools.

Container Seaming Components

Another embodiment of this invention is enabling the packaging industry to produce new design tooling with tailored material compositions. This embodiment will provide for (1) increased machining speed, (2) high toughness, and (3) wear resistance materials to enable use of hard metal packaging materials to reduce gauge of packaging materials and lower raw packaging material costs.

Bearings

Another embodiment of this invention is enabling bearings to be manufactured with tailored material compositions on conventional bearing materials. This embodiment will reduce/eliminate rolling contact failure mechanism, enable dry bearing systems and high load carrying capacity for range applications. For example, applications will include dry bearing systems for vacuum pumps, bearing systems for corrosive environment, oil drilling industry, and packaging machinery.

Processing System

FIG. 11 is a schematic view of the processing system according to the present invention. The processing system includes a CNC control 1102, energy source 1104 (compare FIGS. 3, 4, 5, and 6) secondary source 1106 (compare FIG. 6), Multi-Axis Positioning Mechanism 1108 (compare FIG. 3b) for positioning object 1110.

The energy source 1104 may include a first laser having sufficient parameters to vaporize (initiate the a preliminary vapor phase) the constituent elements, a second laser to balance the thermal gas reaction and the stoichiometric chemistry of the gas phase reactions in the preliminary vapor phase, and a third laser to provide thermal balance to avoid there being a substantial thermal gradient in the reacted gases. Generally, the three lasers operate simultaneously, and are directed, using any suitable optics, to the same area on the substrate. Optics may be interposed between the lasers and the surface of the substrate so that the beams emitted by the lasers are either focused or diffused or otherwise altered. Furthermore, a scanner may be used for scanning a respective laser beam in a desired manner.

The secondary source 1106 may include a nozzle for introducing a controlled stream of secondary element into the reaction system, and for directing the stream at the same reaction zone that is being treated by the energy source 1104. In an embodiment of the invention, the nozzle will have an orifice extending axially through the nozzle body (compare FIG. 6b). Additional orifices in the nozzle body may be utilized to create a helical flow of an additional gas (compare FIG. 6b).

The CNC control 1102 will have adequate data regarding the energy source 1104 parameters, the number, amount, and type of secondary source 1106, and positioning parameters for the multi-axis positioning mechanism 1108. The CNC control 1102 will have predetermined configurations for a desired treatment. In this manner, the energy source 1104 parameters, e.g. wavelength, mode, output power, and energy, as well as other elements which may be used, the secondary source 1106, and multi-axis position mechanism 1108 may be configured and controlled to obtain the desired composite material. These parameters may be configured to achieve any desired treatment at any moment of time or process in steps mentioned in FIG. 1. The CNC control 1102 may also receive instructions from a program, e.g., a stereolithographic file, or any other file which may define the shape of the desired object and/or material.

A multi-axis positioning mechanism 1108 suitable for moving a substrate 1110. This multi-axis positioning mechanism 1108 makes it possible to move the substrate, when necessary, in any of the multi-axis directions. The multi-axis positioning mechanism 1108 may be a multi-axis robot.

THEORY OF OPERATION

The discussion that follows is intended to be illuminating, and not limiting.

The use of lasers in conjunction with forming diamond or DLC coatings is of fairly recent vintage, and is only generally well known, and has been discussed briefly hereinabove.

In the present invention, a combination of three distinct lasers is preferably employed, with surprising results and in a non-obvious manner, to form diamond, DLC and other carbonaceous coatings on a substrate, including:

- diamond coatings ($C_x$, where x is the number of carbon atoms in a crystal);
- diamond-like carbon coatings ($C_x$), exhibiting an sp2/sp3 bond structure;
- amorphous carbon coatings ($C_x$), exhibiting an sp2/sp3 bond structure;
- glassy carbon coatings ($C_x$), exhibiting an sp2/sp3 bond structure;
- graphite coatings ($C_x$), exhibiting an sp2 bond structure; and
- fullerenes ($C_x$), exhibiting an sp2 bond structure.

Using three laser beams, in conjunction with dissociation of carbon containing molecules and diffusion of the carbon from the substrate composition provides a high degree of inherent flexibility in and consequent advantages to the technique of the present invention, including:

- converting carbon-containing molecules (already in the substrate, e.g., steel and tungsten carbide) into pure carbon;
- the conversion to pure carbon may occur below the surface (i.e., in the conversion zone) or above the surface, and is limited only by the amount of carbon containing molecules existing in the substrate;
- the lasers, depending on the particular application, may either be focused (e.g., for faster reaction, ablation of the surface) or de-focused (e.g, for slower reaction, diffusion);

One of the lasers is an ultraviolet laser, such as an XeCl or KrF excimer laser. This is useful in the context of introducing a carbon-containing secondary element such as carbon monoxide (CO). By using an XeCl or KrF excimer laser, single photon energies are in the order of bond dissociation of common carbon-containing molecules. Hence, such a laser can break chemical bonds and neutralize molecules to form plasmas. The bond dissociation energy of carbon monoxide is 1077 kJ/mol, a relatively strong (if not the strongest) bond among carbon-containing molecules. Upon analysis of the single photon energy levels and the electronic diagram of the CO molecule, it is evident that the triple photon processes of either XeCl or KrF laser can break CO bonds to provide active species like carbon atoms, carbon ions, etc., which are useful as diamond precursors.

The infrared (IR) lasers (e.g, Nd:Yag and $CO_2$) also contribute to the overall reaction. The single photon energy levels of these lasers is just sufficient to move molecules to their vibrationally and rotationally excited states. IR lasers are typically not powerful enough to break chemical bonds or knock off electrons from neutral molecules. Therefore, they normally cannot dissociate molecules by themselves unless they are used in conjunction with resonant multiphoton processes or in an induced chemical reaction. A $CO_2$ laser, however, is generally very powerful, and can supply high photon density which makes multiphoton processes viable. Such multiphoton processes are able to initiate further reactions and depositions. A $CO_2$ laser can generate conditions analogous to high-pressure, high-temperature (HPHT) processes.

As mentioned above, a nozzle (see, e.g., FIG. 6a) is optionally used to introduce a secondary element into the reaction system, and the secondary element may be in gaseous form. Additionally, it was mentioned that a shielding gas can be used to contain the desired secondary element.

An inert (i.e. to the overall reaction which is occurring) gas may be used to deliver the secondary element. The use of an inert gas will (a) prevent oxidation, (b) create an "envelope" for the secondary element, (c) direct the flow of a carbon-containing gas onto the substrate. Depending upon the choice of carbon-containing gas, the inert gas may be selected from the group consisting of He, Ne, Ar, Kr, Xe, and N—the first three of these being the most cost-effective.

The gas delivered by the nozzle may also function as an "energy-transfer" gas (agent), in which case the gas will be used to absorb energy for delivery to the carbonaceous species in the carbon-containing gas, which will contribute to breaking the bond in the carbon-containing gas. Depending on the carbon-containing gas selected (e.g., CO, $CO_2$, etc.), and upon the laser source employed (e.g., an infrared laser having a low photon energy level, or an ultraviolet laser having a high photon energy level), the energy-transfer gas may advantageously be selected from the group consisting of He, Ne, AR, Kr, Xe, N, H, and $SF_6$.

To enhance the growth of diamond and DLC coatings on the substrate, a carbon-containing gas may be introduced as a secondary element to the reaction system. Appropriate choices for a secondary element include:

(I) oxides of carbon, such as carbon dioxide ($CO_2$) and carbon monoxide (CO), (II) Organic molecules, such as methane gas ($CH_4$), ethane gas ($C_2H_6$), ethylene ($C_2H_4$), propane ($C_3H_8$), butane ($C_4H_{10}$), hexane ($C_6H_{12}$), or (III) polymers, such as materials containing hydrogen, and oxygen atoms, and (IV) acetone ($CH_3COCH_3$).

The teachings of the prior art (e.g., as represented by U.S. Pat. No. 4,981,717) are generally limited to suggesting using an infrared ($CO_2$) laser in connection with sulfur-hexafluoride ($SF_6$) gas to transfer sufficient energy to break the carbon-hydrogen bonds in methane ($CH_4$).

In contrast, according to the present invention, an infrared laser ($CO_2$) may employed with an ethylene ($C_2H_4$) gas (as the secondary source of carbon). According to the techniques of the present invention, the laser is sufficient for breaking the ethylene bonds. No other gas or agent (e.g, $SF_6$) is required for transferring energy to break the carbon bonds.

According to the present invention, a powerful $CO_2$ laser may be used (in combination with other lasers). The $CO_2$ laser can supply very high photon density which makes multiphoton processes viable. Such multiphoton processes are able to initiate further reactions and depositions, and can generate conditions akin to high-pressure, high-temperature processes.

Preferred Embodiment of Delivering the Secondary Element

As mentioned above, various gases can be used for various purposes in augmenting the reaction.

Figure 12A:
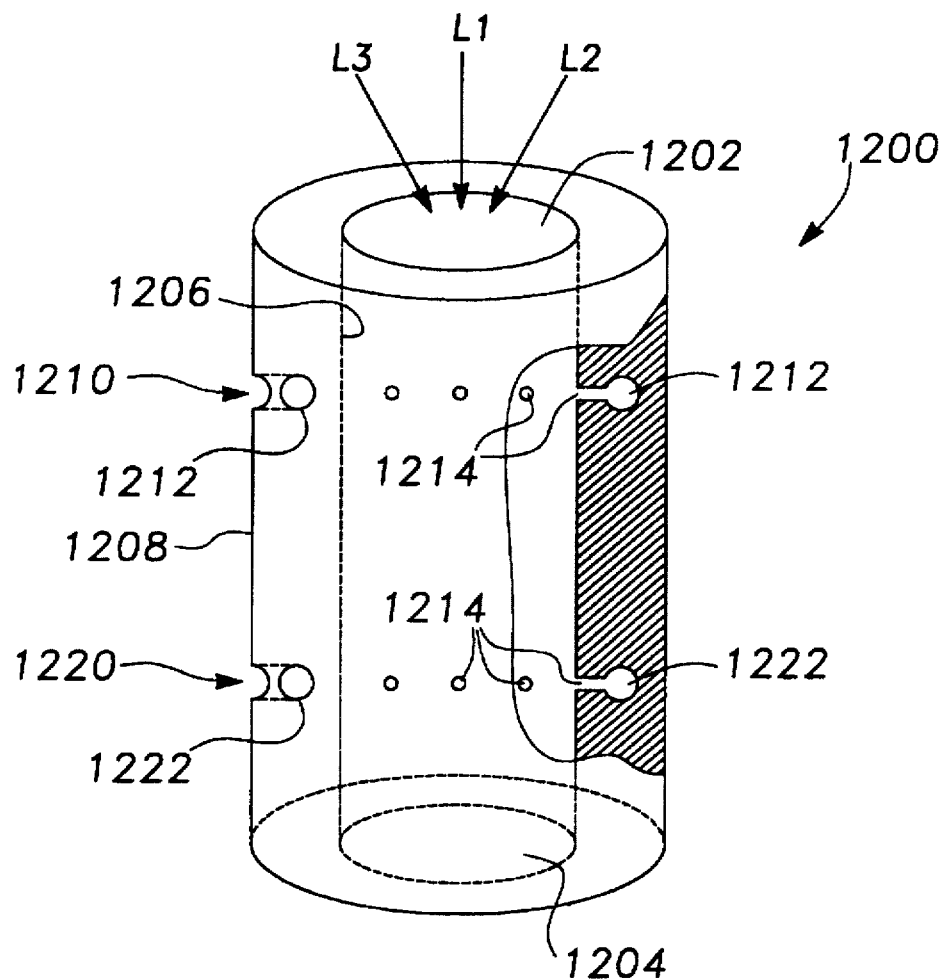
FIGS. 12a is a perspective, partially cut-away view of a nozzle for introducing gases into the reaction system, according to the present invention.
Figure 12B:
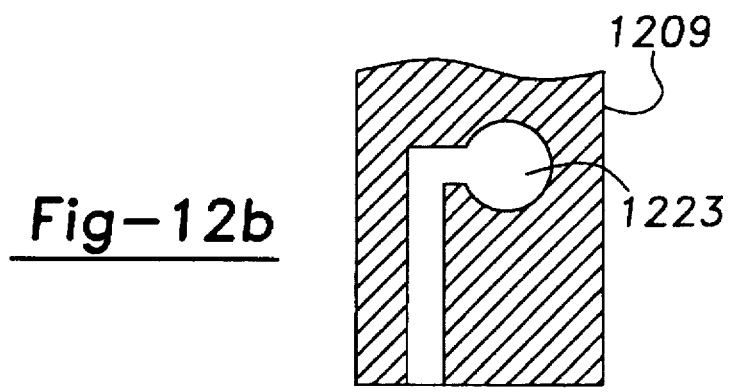

FIGS. 12a–b shows an embodiment of a nozzle for delivering gases e.g., as secondary elements), according to the present invention.

As shown in FIG. 12a, the nozzle 1200 is generally cylindrical, having a top opening 1202, a bottom opening 1204, and a central cavity 1206 within the body 1208 of the nozzle 1200. The laser energy (e.g., three beams L1, L2, L3) can be directed through the top opening 1202 of the nozzle. The substrate (not shown) would be disposed below the nozzle. The nozzle 1200 has two gas inlets: a first inlet 1210 for receiving a supply of gas containing a carbonaceous secondary element (e.g., CO, $CO_2$, etc.), and a second inlet 1220 for receiving a supply of inert gas (as described hereinabove).

The first gas inlet 1210 communicates with an outer channel 1212 disposed circumferentially (e.g., as a ring) around the body 1208 of the nozzle 1200. A carbon-containing gas is introduced into the first gas inlet 1210 (under predetermined pressures) and flows around the body 1208 of the nozzle through the outer channel 1212. A plurality of inner channels 1214 extend generally radially from the outer channel 1212 into the cavity 1206 of the nozzle, for introducing the carbon-containing gas into the cavity of the nozzle. The inner channels 1214 are preferably downwardly-directed, towards the bottom opening 1204, in order to direct the carbon-containing gas toward the bottom opening 1204 of the nozzle 1200 and, subsequently, towards the substrate upon which a diamond or DLC coating is being fabricated.

The second gas inlet 1220 communicates with an outer channel 1222 disposed circumferentially (e.g., as a ring) around the body 1208 of the nozzle 1200. An inert gas (as described hereinabove) is introduced into the second gas inlet 1220 (under predetermined pressures) and flows around the body 1208 of the nozzle through the outer channel 1222. A plurality of inner channels 1224 extend generally radially from the outer channel 1222 into the cavity 1206 of the nozzle, for introducing the carbon-containing gas into the cavity of the nozzle. The inner channels 1224 may be downwardly-directed, towards the bottom opening 1204, in order to direct the inert gas toward the bottom opening 1204 of the nozzle 1200 and, subsequently, towards the substrate upon which a diamond or DLC coating is being fabricated.

Generally, the outer channels 1212 and 1222 are analogous to a runner for a transfer mold, and the inner channels 1214 and 1224 are analogous to the gates of a transfer mold.

Alternatively, the inner channels 1225 (comparable to 1224) can be directed axially downwardly, through the body 1209 (comparable to 1208), to exit at the bottom of the nozzle, as shown in FIG. 12b.

Figure 13:
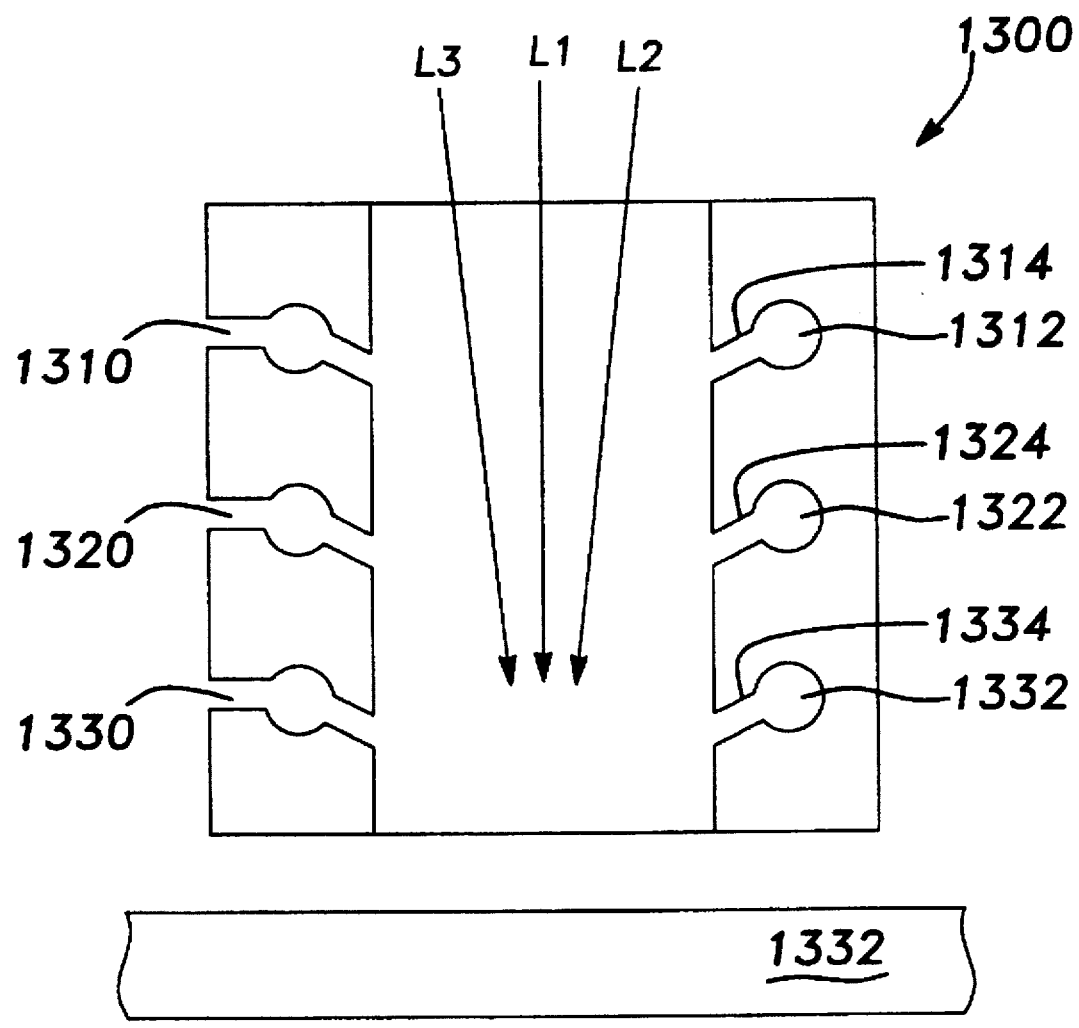
FIG. 13 is a side view of the diamond or DLC coating fabrication system in operation, utilizing a nozzle similar to that of FIGS. 12a–b, according to the present invention.

FIG. 13 shows an alternate embodiment of a nozzle 1300 which is particularly well-suited to introducing three gases to the reaction system, as described hereinabove, and is generally an extension of the concepts described with respect to the two-gas nozzle of FIGS. 12a and 12b.

As in FIGS. 12a and 12b, three lasers may be used to direct beams (L1, L2, L3) through the nozzle 1300 onto a surface of a substrate 1302 upon which it is desired to fabricate a diamond or DLC coating. Three gas inlets 1310, 1320 and 1330 (similar to 1210, 1220) are shown, each having corresponding outer channels 1312, 1322 and 1332 (similar to 1212, 1222) and corresponding inner channels 1314, 1324, 1334 (similar to 1214 and 1224). The inner channels 1314, 1324 and 1334 are shown downwardly-angled (towards the bottom of the nozzle).

Preferably, one or more of the sets of inner channels (1314, 1324, 1334) are angled circumferentially so that the gas introduced into the nozzle cavity by those inner channels creates a "whirling vortex". Such a vortex will either contain one or more of the or may be contained by one or more of the other gases. As mentioned above, a "shielding" gas may be used to contain and direct the carbon-containing gas. Alternatively, the carbon-containing gas may be introduced in a whirling vortex In either of the nozzle embodiments described hereinabove (FIGS. 12a, 12b, 13), it is preferred that the carbon-containing gas be introduced at the topmost inlet (1210, 1310) to be acted upon by the laser beams entering the nozzle.

The above, and other objects, features, advantages and embodiments of the invention, including other (i.e., additional) embodiments of the techniques discussed above may become apparent to one having ordinary skill in the art to which this invention most nearly pertains, and such other and additional embodiments are deemed to be within the spirit and scope of the present invention.

What is claimed is:

1. A method for treating a substrate having a carbon constituent element, the method comprising the steps of:
   directing laser energy at a surface of the substrate;
   activating selected amounts of the carbon constituent element within the substrate through the use of said laser energy thereby effecting movement of the carbon constituent element toward said surface of the substrate;
   vaporizing selected amounts of a carbon constituent element from the substrate; and
   modifying the structure of the vaporized carbon constituent element through the use of said laser energy to form from the vaporized carbon constituent element a diamond or diamond-like carbon material on said surface of the substrate.

2. The method according to claim 1, further including the step of continuing to direct the laser energy at the surface of the substrate, thereby forming said diamond or diamond-like carbon material immediately under said surface of the substrate.

3. The method according to claim 1, further including the step of inducing, with said laser energy, physical stresses in said diamond or diamond-like carbon coating being fabricated.

4. The method according to claim 1, further including the step of surface finishing said coating with said laser energy.

5. The method according to claim 1, further including the step of continuing to direct said laser energy at said surface of the substrate so as to fabricate a multi-layer diamond or diamond-like carbon coating on the substrate, one of said multi-layers being on said surface of the substrate, each of the remaining multi-layers being disposed atop another of the remaining ones of said multi-layers.

6. The method according to claim 1, further including the step of directing a secondary element at the substrate wherein said secondary element is a carbon-containing material.

7. The method according to claim 1, further including the step of directing a secondary element at the substrate wherein said secondary element is a carbon-containing material selected from the group consisting of methane, ethane, ethylene, propane, butane, hexane, carbon monoxide and carbon dioxide.

8. The method according to claim 1, further including the step of directing a secondary element at the substrate wherein said secondary element is a carbon-containing polymer material containing hydrogen and oxygen.

9. The method according to claim 1, further including the step of directing a secondary element at the substrate wherein said secondary element is acetone.

10. The method according to claim 1, further including the step of electrically biasing the substrate.

11. The method according to claim 1, further including the step of directing said laser energy at only selected areas of said surface of the substrate.

12. The method according to claim 1, wherein the substrate is a steel material.

13. The method according to claim 12, wherein said steel material is stainless steel.

14. The method according to claim 12, wherein said steel material is carbide steel.

15. The method according to claim 1, wherein said laser energy is provided by three distinct lasers, a first laser, a second laser and a third laser, each directed at the same surface of the substrate at least one of the three lasers performing the vaporization step.

16. The method according to claim 15, wherein said first laser is an excimer laser.

17. The method according to claim 16, wherein said excimer laser is pulsed.

18. The method according to claim 15, wherein said second laser is a Nd:YAG laser.

19. The method according to claim 15, wherein said third laser is a $CO_2$ laser.

20. The method according to claim 15, wherein said first laser is an excimer laser, said second laser is a Nd:YAG laser, and said third laser is a $CO_2$ laser.

21. A method for treating a substrate having a carbon constituent element, comprising the steps of:
   directing laser energy at a surface of the substrate, and with said laser energy:
   (a) causing localized heating of selected amounts of a carbonaceous element within the substrate so as to move said carbonaceous element toward said surface of the substrate to be vaporized by said laser energy;
   (b) modifying the structure of said vaporized carbonaceous element by said laser energy; and
   (c) forming, from said vaporized carbon constituent element, a diamond or diamond-like carbon material at least on said surface of the substrate.

22. A method of treating a substrate having a carbon constituent element, comprising the steps of:
   directing laser energy at a surface of the substrate, and with said laser energy:
   (a) causing localized heating of selected amounts of a carbon-containing element within the substrate so as to move said carbon-containing element toward said surface of the substrate to be vaporized by said laser energy;
   (b) modifying the structure of said vaporized carbon-containing element by said laser energy; and
   (c) forming, from said vaporized carbon constituent element, a diamond or diamond-like carbon material at least on said surface of the substrate.

23. A method for treating a substrate having a carbon constituent element, the method comprising the steps of:
   directing laser energy at a surface of the substrate;
   activating selected amounts of the carbon constituent element within the substrate through the use of said laser energy thereby effecting movement of the carbon constituent element toward said surface of the substrate;
   vaporizing selected amounts of the carbon constituent element through the use of said laser energy; and
   modifying the structure of the vaporized carbon constituent element through the use of said laser energy to form from the vaporized carbon constituent element a diamond or diamond-like carbon material at least on said surface of the substrate.

* * * * *